United States Patent
Kagotoshi et al.

(10) Patent No.: US 9,048,264 B2
(45) Date of Patent: Jun. 2, 2015

(54) MANUFACTURING METHOD OF SEMICONDUCTOR DEVICE AND SEMICONDUCTOR DEVICE

(71) Applicant: RENESAS ELECTRONICS CORPORATION, Kanagawa (JP)

(72) Inventors: Yasuaki Kagotoshi, Kanagawa (JP); Koichi Arai, Kanagawa (JP); Natsuki Yokoyama, Tokyo (JP); Haruka Shimizu, Tokyo (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 14/220,447

(22) Filed: Mar. 20, 2014

(65) Prior Publication Data
US 2014/0284625 A1 Sep. 25, 2014

(30) Foreign Application Priority Data
Mar. 21, 2013 (JP) ................................. 2013-057949

(51) Int. Cl.
*H01L 21/337* (2006.01)
*H01L 21/00* (2006.01)
(Continued)

(52) U.S. Cl.
CPC .... *H01L 29/66893* (2013.01); *H01L 29/66068* (2013.01); *H01L 29/8083* (2013.01); *H01L 29/1066* (2013.01); *H01L 29/1608* (2013.01)

(58) Field of Classification Search
CPC ............ H01L 29/8083; H01L 29/1066; H01L 29/66068; H01L 29/66893; H01L 29/1608
USPC ......... 438/105, 186, 192, 212, 259, 268, 270, 438/931
See application file for complete search history.

(56) References Cited

U.S. PATENT DOCUMENTS 6,368,921 B1 * 4/2002 Hijzen et al. .................. 438/270
8,785,278 B2 * 7/2014 Yilmaz et al. ................. 438/270
(Continued)

FOREIGN PATENT DOCUMENTS

| JP | 10-294471 A | 11/1998 |
| JP | 2004-134547 A | 4/2004 |

(Continued)

OTHER PUBLICATIONS

Shimizu et al., "Normally-off 4H-SiC Vertical JFET with Large Current Density", Mater. Sci, Forum 600-603. 1059 (2009).

(Continued)

*Primary Examiner* — Hung Vu
(74) *Attorney, Agent, or Firm* — Mattingly & Malur, PC

(57) ABSTRACT

A manufacturing method of a junction field effect transistor includes the steps of: (a) forming an $n^+$-type source layer on a surface of an $n^-$-type drift layer formed on an $n^+$-type SiC substrate; (b) forming a plurality of shallow trenches disposed at predetermined intervals by etching the surface of the $n^-$-type drift layer with a silicon oxide film formed on the $n^-$-type drift layer used as a mask; (c) forming an n-type counter dope layer by doping the $n^-$-type drift layer below each of the shallow trenches with nitrogen by using a vertical ion implantation method; (d) forming a sidewall spacer on each sidewall of the silicon oxide film and the shallow trenches; and (e) forming a p-type gate layer by doping the $n^-$-type drift layer below each of shallow trenches with aluminum by using the vertical ion implantation method.

5 Claims, 21 Drawing Sheets

(51) Int. Cl.
*H01L 21/8238* (2006.01)
*H01L 29/66* (2006.01)
*H01L 29/808* (2006.01)
*H01L 29/10* (2006.01)
*H01L 29/16* (2006.01)

(56) References Cited

U.S. PATENT DOCUMENTS

| | | | |
|---|---|---|---|
| 8,785,279 B2 * | 7/2014 | Bhalla et al. | 438/270 |
| 2004/0135178 A1 | 7/2004 | Onose et al. | |
| 2005/0218424 A1 | 10/2005 | Onose et al. | |
| 2007/0096145 A1 | 5/2007 | Watanabe | |
| 2010/0163935 A1 | 7/2010 | Shimizu et al. | |
| 2011/0198613 A1 | 8/2011 | Shimizu et al. | |
| 2012/0205668 A1 | 8/2012 | Watanabe | |

FOREIGN PATENT DOCUMENTS

| | | |
|---|---|---|
| JP | 2007-128965 A | 5/2007 |
| JP | 2011-171421 A | 9/2011 |
| WO | 2012/131768 A1 | 10/2012 |

OTHER PUBLICATIONS

European Search Report received in corresponding European Application No. 14160755 dated Oct. 27, 2014.

* cited by examiner

MANUFACTURING METHOD OF SEMICONDUCTOR DEVICE AND SEMICONDUCTOR DEVICE

CROSS-REFERENCE TO RELATED APPLICATIONS

The present application claims priority from Japanese Patent Application No. 2013-057949 filed on Mar. 21, 2013, the content of which is hereby incorporated by reference to this application.

TECHNICAL FIELD

The present invention relates to a manufacturing method of a semiconductor device and a semiconductor device, and more particularly relates to a technique effectively applied to a semiconductor device having a junction field effect transistor (JFET) formed on a silicon carbide (SiC) substrate.

BACKGROUND

A junction field effect transistor (hereinafter, referred to as junction FET) which controls a channel with using a pn junction as a gate has been known as one of power semiconductor elements. In particular, a junction FET using SiC as a substrate material is excellent in withstand voltage characteristic because SiC has a dielectric breakdown field larger than that of Si, and since the pn junction has a high diffusion potential, a so-called normally-off FET, which can completely deplete a channel even without applying a negative voltage to a gate, can be achieved.

Japanese Patent Application Laid-Open Publications No. 2007-128965 (Patent Document 1) and No. 2011-171421 (Patent Document 2) disclose trench-type junction FETs. In the junction FETs disclosed in these Patent Documents, a trench is formed in an n$^-$-type drift layer epitaxially grown on a SiC substrate and the sidewalls and the bottom surface of the trench are doped with p-type impurities such as Al (aluminum) by using an oblique ion implantation method and a vertical ion implantation method in combination, thereby forming a p-type gate region.

An on-resistance which is one of important characteristics representing the performance of a junction FET can be reduced by increasing an interval between adjacent gate regions. If doing so, however, the source and drain withstand voltages at the time of a reverse bias are decreased. More specifically, the on-resistance and the source and drain withstand voltages have a tradeoff relation with the interval between gate regions as a parameter. Therefore, the control of this parameter is very important for the improvement of the performance of the junction FET.

Mater. Sci, Forum 600-603. 1059 (2009) (Non-Patent Document 1) reports that it is possible to improve the above-described tradeoff relation between the on-resistance and the source and drain withstand voltages by making the impurity concentration profile of the p-type gate region steep. Although the Non-Patent Document 1 does not describe how to make the impurity concentration profile steep, for example, a method in which an oblique ion implantation method is used to dope the sidewalls of the trench with n-type impurities (for example, nitrogen), thereby compensating for the impurity concentration at an end of the p-type gate region may be adopted (see FIG. 3 of Non-Patent Document 1).

Japanese Patent Application Laid-Open Publication No. 10-294471 (Patent Document 3) relates to a planar-type junction FET. The Patent Document 3 describes that the performance of the junction FET can be further improved by making a retrograde profile in which the width of the p-type gate region on a drain side is wider than that on a source side. Here, the width of the p-type gate region is adjusted by ion implantation energy and the dose amount of impurities.

On the other hand, Japanese Patent Application Laid-Open Publication No. 2004-134547 (Patent Document 4) which relates to a trench-type junction FET discloses a method in which the width of the p-type gate region on the drain side is made wider than that on the source side by making the acceleration voltage at the time of ion implantation of impurities to the bottom surface of the trench lower than the acceleration voltage at the time of ion implantation of impurities to the sidewalls of the trench (see FIG. 5 of the Patent Document 4).

PRIOR ART DOCUMENTS

Patent Documents

Patent Document 1: Japanese Patent Application Laid-Open Publication No. 2007-128965
Patent Document 2: Japanese Patent Application Laid-Open Publication No. 2011-171421
Patent Document 3: Japanese Patent Application Laid-Open Publication No. 10-294471
Patent Document 4: Japanese Patent Application Laid-Open Publication No. 2004-134547

Non-Patent Documents

Non-Patent Document 1: Mater. Sci, Forum 600-603. 1059 (2009)

SUMMARY

For the accurate control of the interval between adjacent p-type gate regions and the impurity concentration profile of the p-type gate region in the above-described conventional trench-type junction FET, there are many parameters be controlled such as the taper angle of the trench, the film thickness and shape of an oxide film used as an etching mask for the trench, and angle accuracy of an ion implantation device in addition to the process dimensions of the trench. For this reason, in consideration of mass productivity, it is difficult to ensure a process margin to obtain stable high yields.

Also, for the improvement of the performance of the junction FET, in particular, for the reduction of the on-resistance, it is required to increase a ratio of the source area occupying the active region, and for its achievement, the reduction of the width of the gate region is necessary. In a conventional art, however, since the gate region is formed by doping the sidewalls of the trench with impurities by an oblique ion implantation method, if the width of the trench is narrowed, a ratio of the depth with respect to the width of the trench (aspect ratio) is increased, so that it becomes difficult to dope the sidewalls of the region with impurities. More specifically, it is difficult to reduce the width of the gate region in the conventional method in which the gate region is formed by doping the sidewalls of the trench with impurities by the oblique ion implantation method.

Other problems and novel features will become apparent from the description of the specification and the attached drawings.

One embodiment of this application is a manufacturing method of a semiconductor device having a junction field effect transistor formed on a main surface of a semiconductor substrate of a first conductivity type, and the method includes:

(a) a step of forming a source layer of the first conductivity type on a surface of a drift layer of the first conductivity type formed on the semiconductor substrate;

(b) after the step (a), a step of forming a plurality of trenches disposed at predetermined intervals by etching the surface of the drift layer with a first insulating film formed on the drift layer used as a mask;

(c) after the step (b), a step of forming a counter dope layer of the first conductivity type by doping the drift layer below each of the plurality of trenches with impurities by using a vertical ion implantation method;

(d) after the step (c), a step of forming a sidewall spacer on each sidewall of the first insulating film and the trenches; and (e) after the step (d), a step of forming a gate layer of a second conductivity type by doping the drift layer below each of the plurality of trenches with third impurities by using the vertical ion implantation method.

According to the embodiment mentioned above, high-performance junction FETs can be manufactured with high yields.

DETAILED DESCRIPTION

Hereinafter, embodiments of the present invention will be described in detail with reference to the accompanying drawings. Note that components having the same function are denoted by the same reference symbols throughout the drawings for describing the embodiments, and the repetitive description thereof will be omitted. In addition, in the embodiments below, the description of the same or similar portions is not repeated in principle unless particularly required. Also, in some drawings used in the following embodiments, hatching is used even in a plan view and hatching is omitted even in a sectional view so as to make the structure easily understood.

First Embodiment

Figure 1:
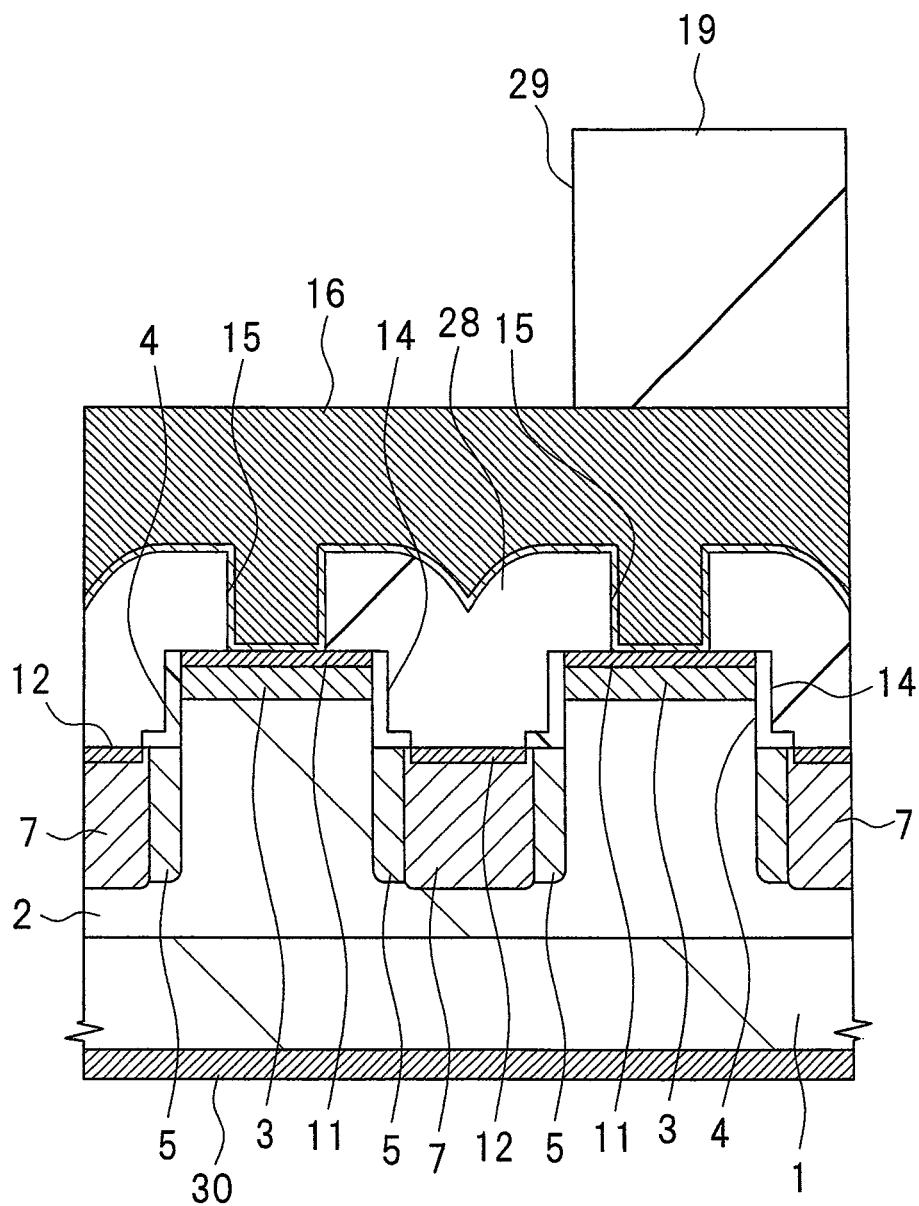
FIG. 1 is a sectional view of a part of an active region of a SiC substrate having a vertical junction FET of a first embodiment formed thereon.

FIG. 1 is a sectional view of a part of an active region of a SiC substrate having a vertical junction FET of a first embodiment formed thereon.

On a main surface of an $n^+$-type SiC substrate 1 serving as a drain region of the vertical junction FET, an $n^-$-type drift layer 2 having an impurity concentration lower than that of the $n^+$-type SiC substrate 1 is formed, and on a surface of the $n^-$-type drift layer 2, a plurality of $n^+$-type source layers 3 having an impurity concentration higher than that of the $n^+$-type SiC substrate 1 are formed at predetermined intervals. These $n^+$-type source layers 3 extend in a stripe shape along a first direction (vertical direction with respect to the paper sheet) of the main surface of the $n^+$-type SiC substrate 1.

On the surface of each of the $n^+$-type source layers 3, a source contact layer 11 made of a Ni (nickel) silicide film is formed. The source contact layer 11 is electrically connected to a source electrode 16 through a contact hole 15 formed in an interlayer insulating film 28 which covers the $n^+$-type source layer 3. The interlayer insulating film 28 is made of a silicon oxide film, and the source electrode 16 is made of a metal film containing Al (aluminum) as a main component.

In the surface of the $n^-$-type drift layer 2, shallow trenches 4 are formed between adjacent $n^+$-type source layers 3 along an extending direction (first direction) of the $n^+$-type source layers 3, and on the $n^-$-type drift layer 2 below each shallow trench 4, a p-type gate layer 7 is formed. Also, a sidewall spacer 14 made of a silicon oxide film is formed on each sidewall of the shallow trenches 4. Furthermore, in the $n^-$-type drift layer 2 below the sidewall spacer 14, an n-type counter dope layer 5 is formed so as to be adjacent to the p-type gate layer 7.

One of the features of the vertical junction FET of the first embodiment is that, as shown in FIG. 1, the bottom surface of the shallow trench 4 is positioned lower than the $n^+$-type source layer 3 and the sidewall spacer 14 made of an insulating material (silicon oxide) is formed on the sidewall of the shallow trench 4, so that the $n^+$-type source layer 3 and the p-type gate layer 7 are not in contact with each other.

Another feature of the vertical junction FET of the first embodiment is that, as will be described further below, the $n^-$-type drift layer 2 below the shallow trench 4 is doped with impurities by using the vertical ion implantation method, thereby forming the n-type counter dope layer 5 and the p-type gate layer 7.

On the surface of the p-type gate layer 7 formed on the $n^-$-type drift layer 2 below the shallow trench 4, a gate contact layer 12 made of a Ni silicide film is formed. The gate contact layer 12 is electrically connected to a gate electrode (gate electrode 17 described further below) made of a metal film of the same layer as the source electrode 16 via a contact hole formed in the interlayer insulating film 28 at an end of the active region (not shown).

On the uppermost portion of the main surface of the $n^+$-type SiC substrate 1, a surface protection film 19 made of a polyimide resin film is formed. As shown in FIG. 1, an opening 29 is formed in the surface protection film 19, and the source electrode 16 exposed on the bottom of the opening 29 forms a source pad. Although not shown, another opening is formed in the surface protection film 19, and the gate electrode 17 exposed on the bottom of this opening forms a gate pad.

Although FIG. 1 shows only a part of the active region of the $n^+$-type SiC substrate 1, a termination layer ($p^-$-type termination layer 8 described further below) for mitigating the electric field of the active region is formed on the circumference of the active region not shown in the drawing. The $p^-$-type termination layer 8 is a p-type semiconductor region formed by ion-implanting impurities to the $n^-$-type drift layer 2 on the circumference of the active region. Also, a guard ring ($n^+$-type guard ring layer 3G and guard ring wiring 18 described further below) is formed on a further outer side of the termination layer, that is, on the outer circumference of the $n^+$-type SiC substrate 1. The $n^+$-type guard ring layer 3G is an n-type semiconductor region formed by ion-implanting impurities to the $n^-$-type drift layer 2 on the outer circumference of the $n^+$-type SiC substrate 1, and the guard ring wiring 18 is made of a metal film of the same layer as the source gate 16 and the gate electrode 17.

On the other hand, a drain electrode 30 is formed on the back surface of the $n^+$-type SiC substrate 1. The drain electrode 30 is made of a conductive film containing Ni (nickel) silicide as a main component. As described above, the vertical junction FET of the first embodiment has a three-terminal structure having the source pad and the gate pad provided on the main surface side of the $n^+$-type SiC substrate 1 and the drain electrode 30 provided on the back surface side of the $n^+$-type SiC substrate 1.

The operation of the vertical junction FET of the first embodiment is basically the same as the operation of a conventional vertical junction FET, and on/off of the current flowing between the source and the drain is switched by controlling the width of a depletion layer extending from the p-type gate layer 7 to the channel ($n^-$-type drift layer 2 below $n^+$-type source layer 3). More specifically, in an OFF state, a negate voltage is applied to the gate (p-type gate layer 7) to expand the depletion layer from the gate to the channel, thereby preventing carriers (electrons) from flowing between the source and the drain. On the other hand, in an ON state, a positive voltage is applied to the gate and the drain to reduce the depletion layer, thereby causing carries (electrons) to flow from the source to the drain.

Next, a manufacturing method of the vertical junction FET of the first embodiment is described with reference to the drawings in the order of the process. Here, a vertical junction FET having a withstand voltage equal to or higher than 600 V is assumed.

Figure 2A:
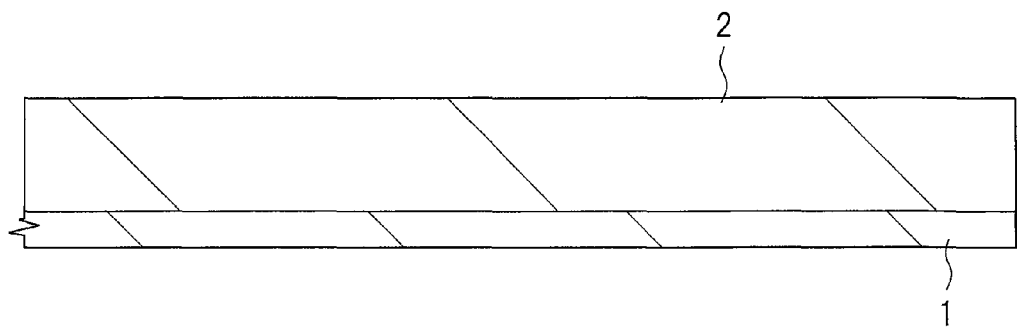
FIG. 2A is a sectional view of a principal part of the SiC substrate showing a manufacturing method of the vertical junction FET of the first embodiment.

First, as shown in FIG. 2A, on the main surface of the n$^+$-type SiC substrate 1 doped with n-type impurities (nitrogen) at a high concentration, the n$^-$-type drift layer 2 is formed by using an epitaxial growth method. The n$^-$-type drift layer 2 has an impurity (nitrogen) concentration of about $2 \times 10^{16}$ atom/cm$^3$ and a thickness of about 6 µm.

Figure 2B:
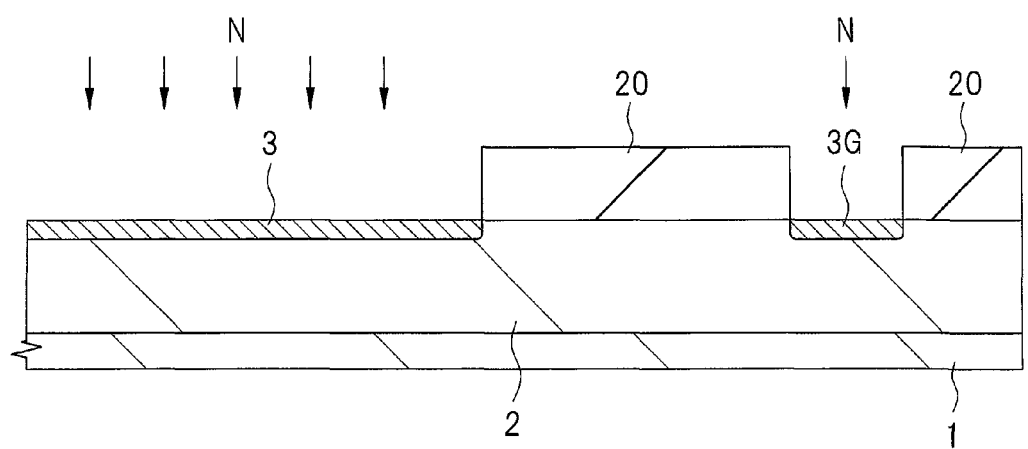
FIG. 2B is a sectional view of a principal part of the SiC substrate showing the manufacturing method of the vertical junction FET continued from FIG. 2A.

Next, as shown in FIG. 2B, a silicon oxide film (first insulating film) 20 is deposited on the main surface of the n$^+$-type SiC substrate 1 by using CVD, and then the silicon oxide film 20 is patterned by dry etching with a photoresist film (not shown) used as a mask. Subsequently, with this silicon oxide film 20 used as a mask, n-type impurities (nitrogen) are ion-implanted to the n$^-$-type drift layer 2, thereby forming the n$^+$-type source layer 3. At this time, the n-type impurities are ion-implanted also to the n$^-$-type drift layer 2 on the outer circumference of the n$^+$-type SiC substrate 1, thereby forming the n$^+$-type guard ring layer 3G surrounding the active region. The n$^+$-type source layer 3 and the n$^+$-type guard ring layer 3G have an impurity concentration of about $1 \times 10^{20}$ atom/cm$^3$.

Figure 2C:
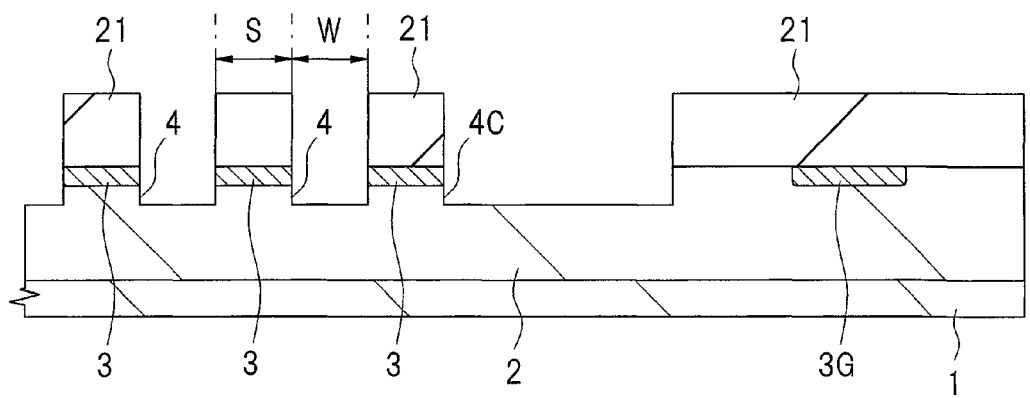
FIG. 2C is a sectional view of a principal part of the SiC substrate showing the manufacturing method of the vertical junction FET continued from FIG. 2B.

Next, after the silicon oxide film 20 is removed, as shown in FIG. 2C, a silicon oxide film 21 is deposited on the main surface of the n$^+$-type SiC substrate 1 by using CVD, and the silicon oxide film 21 is patterned by dry etching with a photoresist film used as a mask. Subsequently, with this silicon oxide film 21 used as a mask, the n$^+$-type source layer 3 and the n$^-$-type drift layer 2 therebelow are subjected to dry etching, thereby forming a plurality of shallow trenches 4. At this time, the n$^-$-type drift layer 2 at an end of the active region is also subject to dry etching, thereby forming a shallow trench 4C having a width wider than that of the shallow trenches 4.

As shown in FIG. 2C, the shallow trenches 4 and 4C are formed so that their bottom surfaces are positioned lower than the n$^+$-type source layers 3. A depth from the surface of the n$^-$-type drift layer 2 to the bottom surface of the shallow trenches 4 and 4C is about 0.5 µm. Also, by forming the plurality of shallow trenches 4 in the n$^-$-type drift layer 2 of the active region, the n$^+$-type source layers 3 are separated via the shallow trenches 4. The width (S) of each of the n$^+$-type source layers 3, in other words, an interval between adjacent shallow trenches 4 is about 1.0 µm. Also, each shallow trench 4 has a width (W) of about 1.0 µm.

Figure 3:
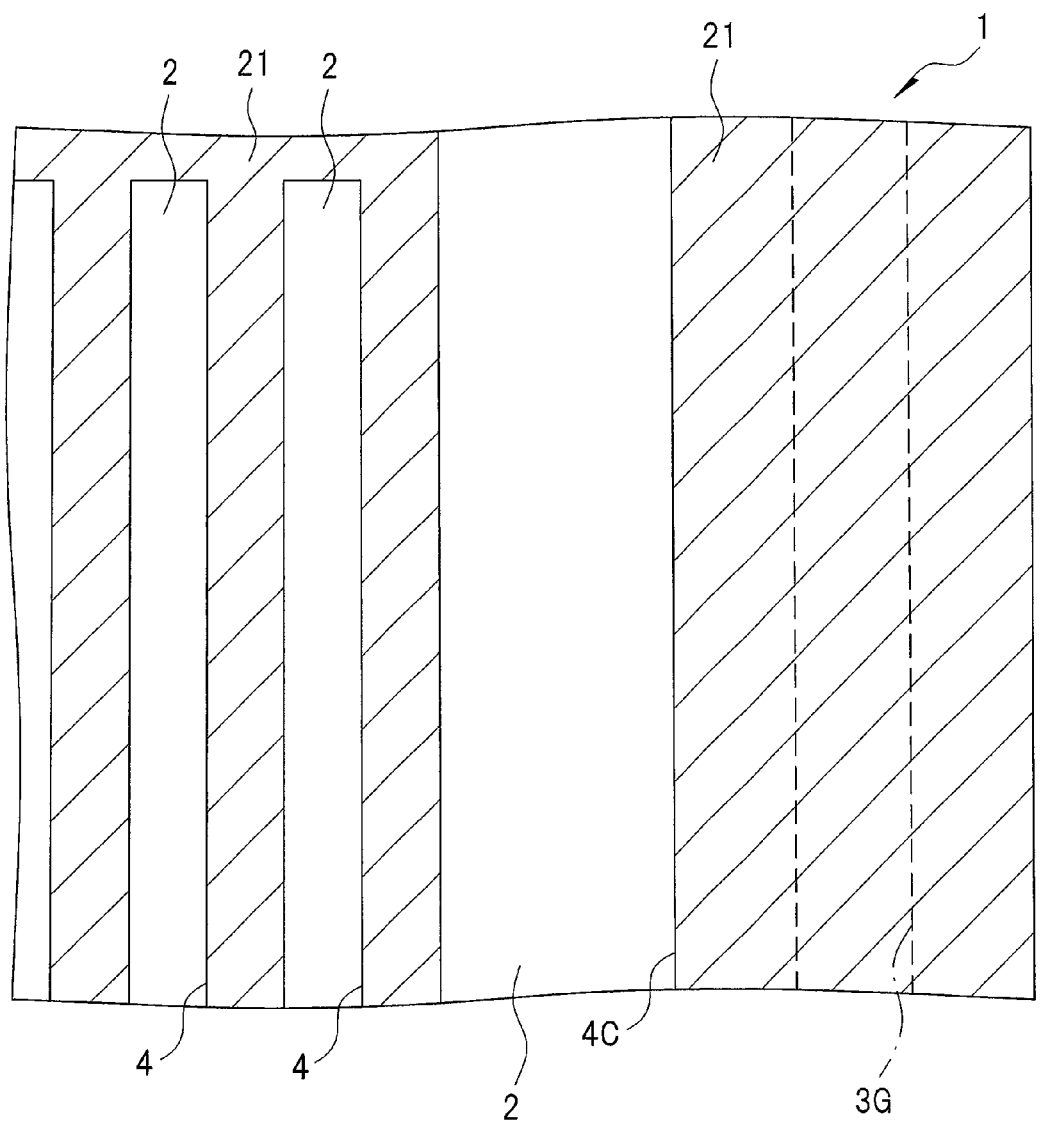
FIG. 3 is a plan view of a principal part of the SiC substrate showing the manufacturing method of the vertical junction FET of the first embodiment.

As shown in FIG. 3, the shallow trenches 4 formed in the n$^-$-type drift layer 2 of the active region extend in a stripe shape along one direction of the main surface of the n$^+$-type SiC substrate 1.

An object of forming the shallow trenches 4 and 4C in the n$^-$-type drift layer 2 is to dope a deep region of the n$^-$-type drift layer 2 with impurities (impurities for forming the n-type counter dope layer 5 and impurities for forming the p-type gate layer 7) in the next ion implantation process. Therefore, when an energy ion implantation device with high acceleration voltage is used to dope the region with impurities, the depth of the shallow trenches 4 and 4C may be shallower than the depth of the n$^+$-type source layer 3.

Figure 4A:
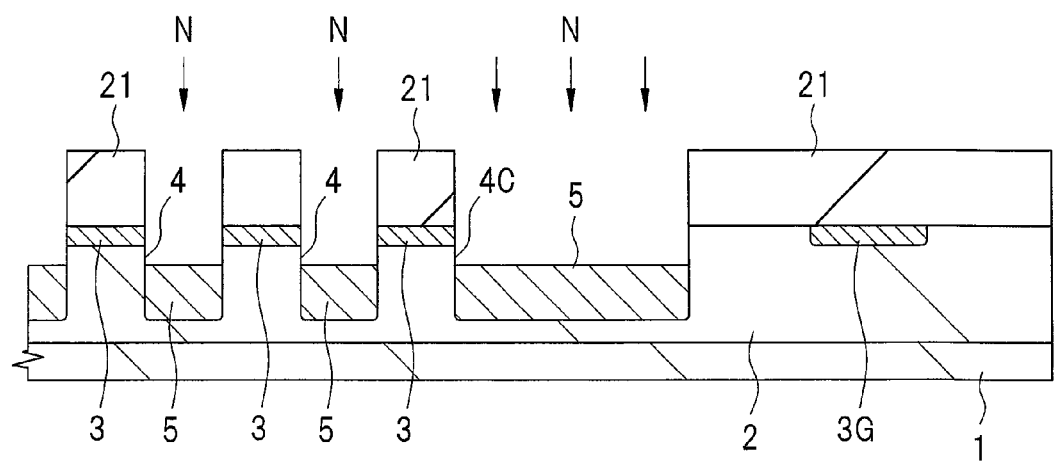
FIG. 4A is a sectional view of a principal part of the SiC substrate showing the manufacturing method of the vertical junction FET continued from FIG. 2C.

Next, as shown in FIG. 4A, with the silicon oxide film 21 used as a mask, n-type impurities (nitrogen) are ion-implanted to the n$^-$-type drift layer 2 below the shallow trenches 4 and 4C, thereby forming the n-type counter dope layers 5. The ion implantation of the n-type impurities is performed by a vertical ion implantation method, and the n-type counter dope layer 5 has the impurity (nitrogen) concentration of about $1 \times 10^{17}$ atom/cm$^3$. Also, the ion implantation of the n-type impurities is performed by multi-step implantation with varied acceleration voltages, and the depth of the n-type counter dope layer 5 is about 0.8 µm to 1 µm from the surface of the n$^-$-type drift layer 2.

The n-type counter dope layer 5 is formed so as to compensate for diffusion of impurities (aluminum) of the p-type gate layer 7 to be formed in the next process in a lateral direction (channel direction) and make the impurity concentration profile of the p-type gate layer 7 steep.

Figure 4B:
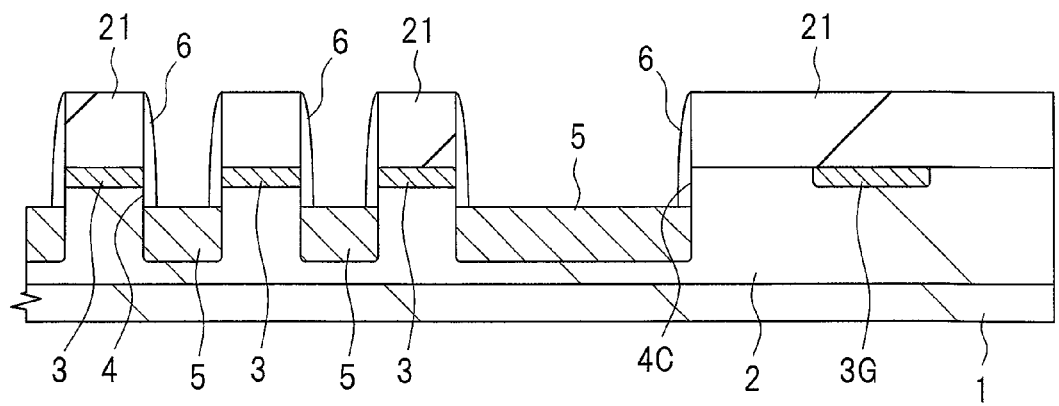
FIG. 4B is a sectional view of a principal part of the SiC substrate showing the manufacturing method of the vertical junction FET continued from FIG. 4A.
Figure 5:
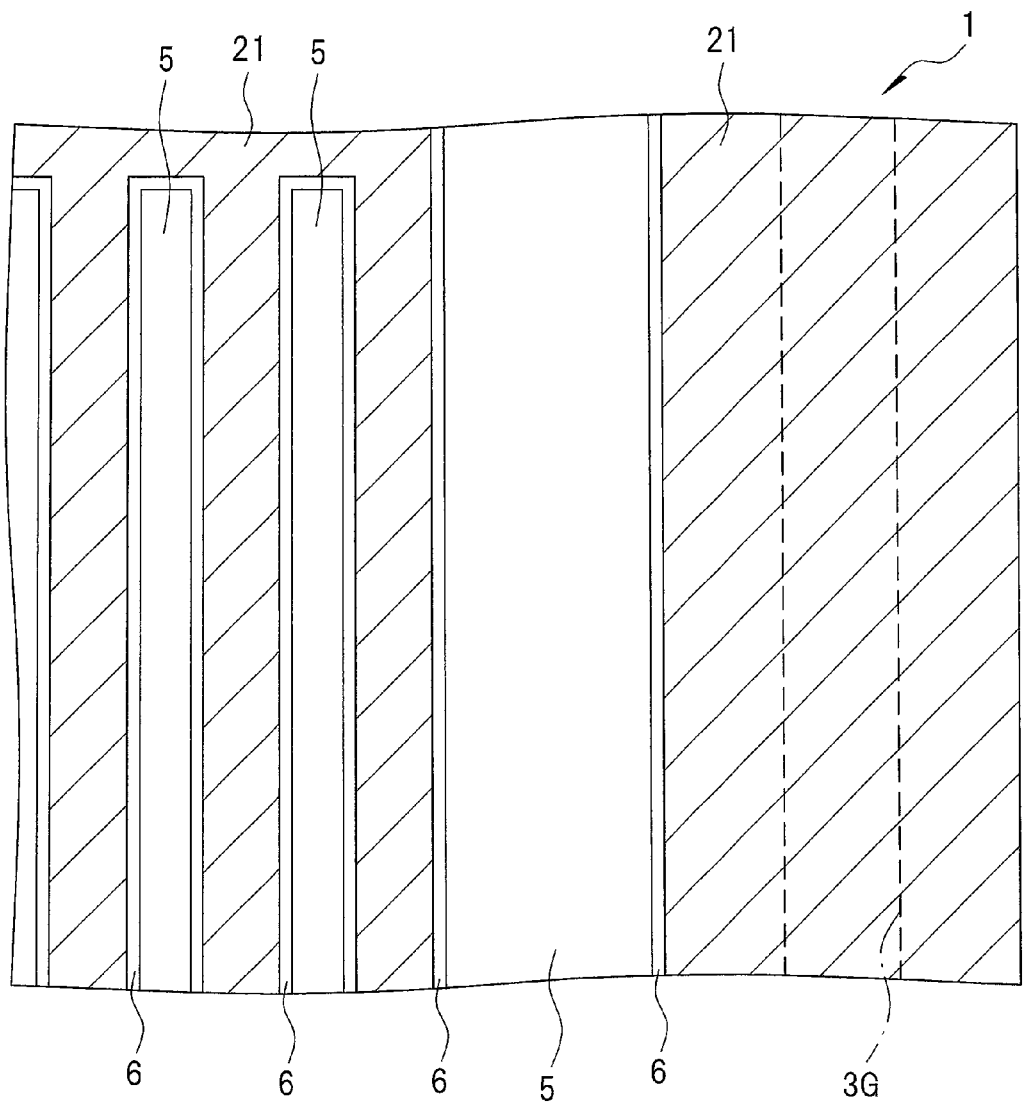
FIG. 5 is a plan view of a principal part of the SiC substrate showing the manufacturing method of the vertical junction FET continued from FIG. 2C.

Next, as shown in FIG. 4B and FIG. 5, the sidewall spacer 6 is formed on each of the sidewalls of the silicon oxide film 21 and the shallow trenches 4 and 4C. The sidewall spacer 6 is formed by depositing a silicon oxide film on the main surface of the n$^+$-type SiC substrate 1 by using CVD and then performing anisotropic etching to this silicon oxide film.

Figure 6A:
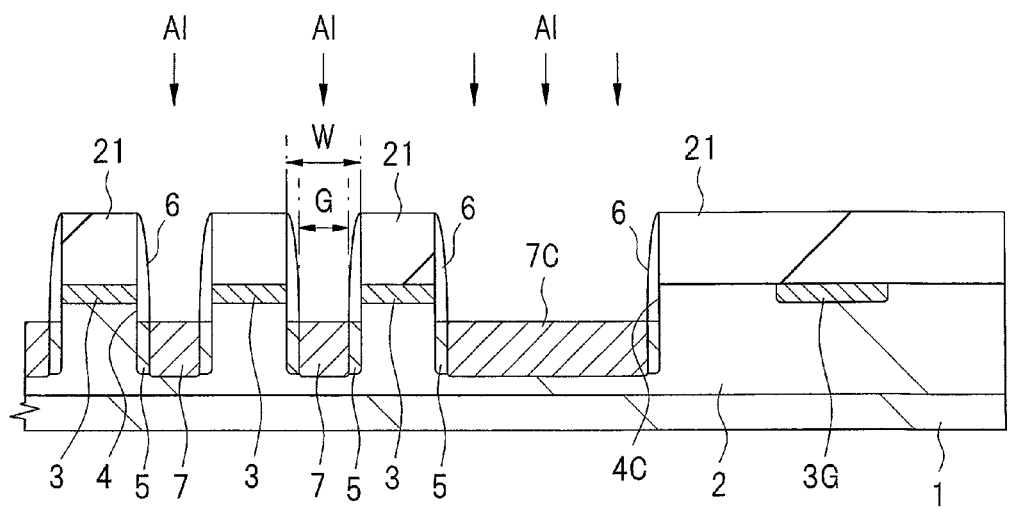
FIG. 6A is a sectional view of a principal part of the SiC substrate showing the manufacturing method of the vertical junction FET continued from FIG. 4B.

Next, as shown in FIG. 6A, with the silicon oxide film 21 and the sidewall spacers 6 used as masks, p-type impurities (aluminum or boron) are ion-implanted to the n$^-$-type drift layer 2 below the shallow trenches 4, thereby forming the p-type gate layers 7 in a self-alignment manner with respect to the sidewall spacers 6. At this time, p-type impurities are ion-implanted also to the n$^-$-type drift layer 2 at the end of the active region, thereby forming a p-type gate layer 7C having a width wider than that of the p-type gate layer 7.

Ion implantation of the p-type impurities is performed by a vertical ion implantation method, and the impurity concentration of the p-type gate layers 7 and 7C is about $1 \times 10^{18}$ atom/cm$^3$. Also, ion implantation of the p-type impurities is performed by multi-step implantation with varied acceleration voltages, and the depth of the p-type gate layers 7 and 7C is approximately equal to the depth of the n-type counter dope layer 5 (about 0.8 µm to 1 µm from the surface of the n$^-$-type drift layer 2).

As described above, in the first embodiment, after the sidewall spacers 6 are formed on the sidewalls of the shallow trenches 4, the n$^-$-type drift layer 2 below the shallow trenches 4 is doped with p-type impurities by using the vertical ion implantation method, thereby forming the p-type gate layers 7 in a self-alignment manner with respect to the sidewall spacers 6.

In this manner, the width (G) of the p-type gate layer 7 can be made narrower than the width (W) of the shallow trench 4. More specifically, when the width (W) of the shallow trench 4 is made narrow to a processing limit, the width (G) of the p-type gate layer 7 can be further made narrower than this processing limit. Also, since the width of the sidewall spacers 6 to be formed on the sidewalls of the shallow trenches 4 can be accurately controlled by defining the film thickness of the silicon oxide film which is a material of the sidewall spacers 6, the width (G) of the p-type gate layer 7 can also be accurately controlled. Furthermore, since the p-type gate layers 7 are formed in the state where the sidewall spacers 6 are formed on the sidewalls of the shallow trenches 4, the n$^+$-type source layers 3 and the p-type gate layers 7 are prevented from being in contact with each other. In particular, in the first embodiment, since the shallow trenches 4 are formed deeper than the n$^+$-type source layers 3, the n$^+$-type source layers 3 and the p-type gate layers 7 are further reliably prevented from being in contact with each other.

Figure 6B:
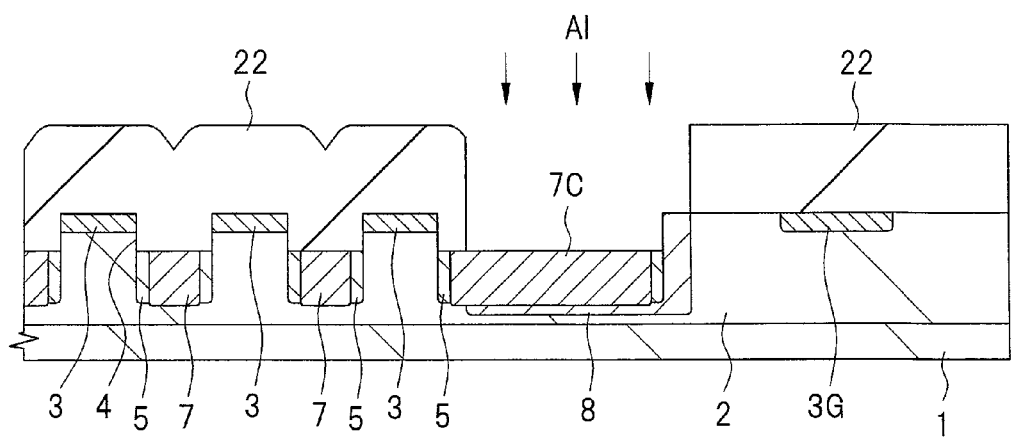
FIG. 6B is a sectional view of a principal part of the SiC substrate showing the manufacturing method of the vertical junction FET continued from FIG. 6A.

Next, after the silicon oxide film 21 and the sidewall spacers 6 are removed, as shown in FIG. 6B, a silicon oxide film 22 is deposited on the main surface of the n$^+$-type SiC substrate 1 by using CVD, and the silicon oxide film 22 is patterned by dry etching with a photoresist film used as a mask. Subsequently, with this silicon oxide film 22 used as a mask, p-type impurities (aluminum or boron) are ion-implanted to the n$^-$-type drift layer 2 on the circumference of the active region, thereby forming the p$^-$-type termination layer 8. The p⁻-type termination layer 8 is a semiconductor region for the purpose of mitigating the electric field of the active region, and is formed in a region deeper than the p-type gate layer 7C. Also, the impurity concentration of the p⁻-type termination layer 8 is about $1 \times 10^{17}$ atom/cm³.

Figure 6C:
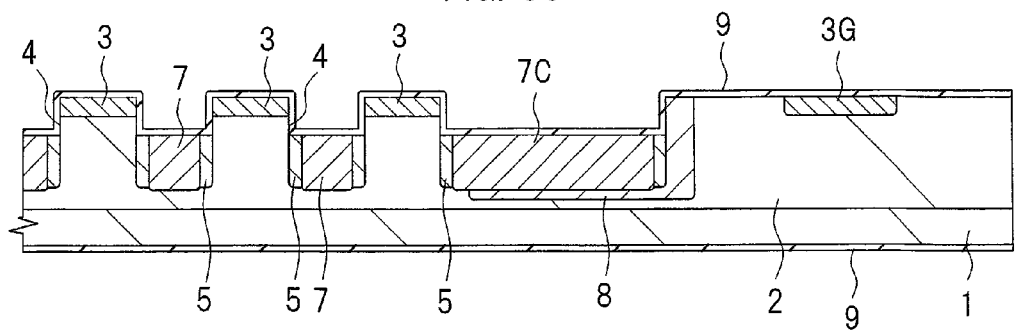
FIG. 6C is a sectional view of a principal part of the SiC substrate showing the manufacturing method of the vertical junction FET continued from FIG. 6B.

Next, after the silicon oxide film 21 and the sidewall spacers 6 are removed, the n⁺-type SiC substrate 1 is annealed, thereby activating the n-type impurities (nitrogen) and the p-type impurities (aluminum or boron) with which the n⁻-type drift layer 2 has been doped in the above-described process. Here, the anneal temperature of the n⁺-type SiC substrate 1 is about 1700° C. to 1800° C. When the n⁺-type SiC substrate 1 is annealed, the main surface side and the back surface side of the n⁺-type SiC substrate 1 are coated with a carbon layer 9 as shown in FIG. 6C in order to prevent vaporization of Si constituting the n⁺-type SiC substrate 1.

Figure 7A:
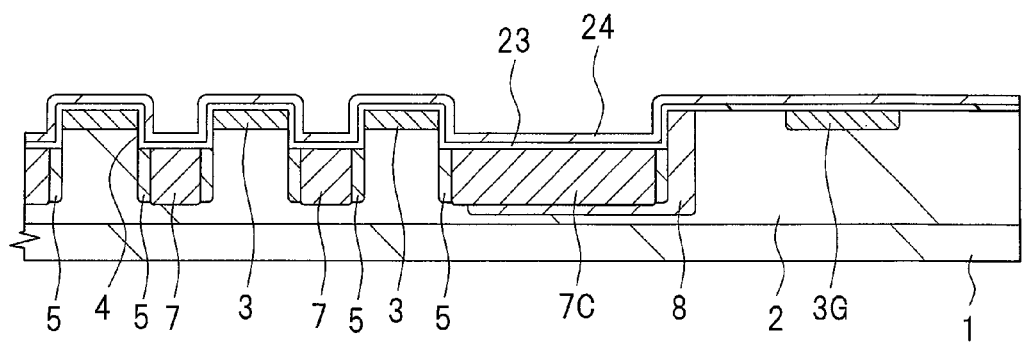
FIG. 7A is a sectional view of a principal part of the SiC substrate showing the manufacturing method of the vertical junction FET continued from FIG. 6C.

Next, after the carbon layer 9 is removed, as shown in FIG. 7A, a silicon oxide film 23 is deposited on the main surface of the n⁺-type SiC substrate 1 by using CVD. Subsequently, a barrier metal film 24 made of a TiN (titanium nitride) film is deposited on the silicon oxide film 23 by using sputtering.

Figure 7B:
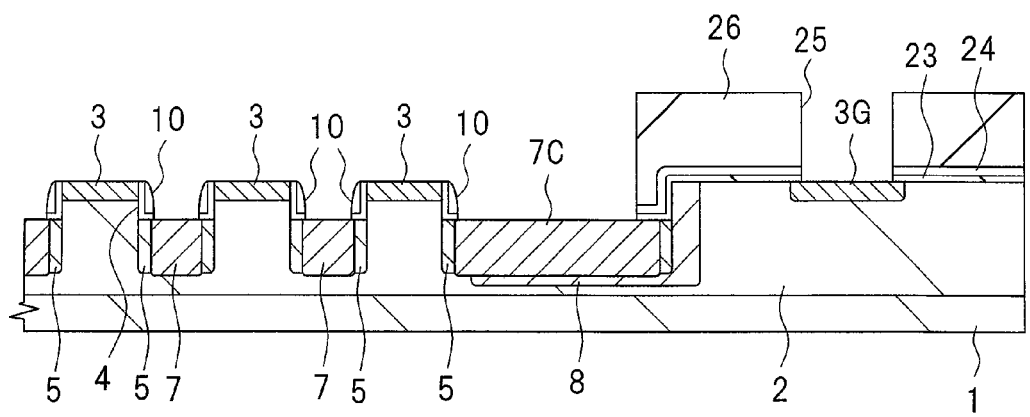
FIG. 7B is a sectional view of a principal part of the SiC substrate showing the manufacturing method of the vertical junction FET continued from FIG. 7A.

Next, as shown in FIG. 7B, the barrier metal film 24 and the silicon oxide film 23 of the active region are subjected to anisotropic etching, thereby forming sidewall spacers 10 made of a laminated film of the barrier metal film 24 and the silicon oxide film 23 on the sidewalls of the shallow trenches 4. At this time, the outside of the active region is covered with a photoresist film 26 having an opening 25 provided above the n⁺-type guard ring layer 3G, and the barrier metal film 24 and the silicon oxide film 23 on the bottom of the opening 25 are etched, thereby exposing the surface of the n⁺-type guard ring layer 3G.

Figure 7C:
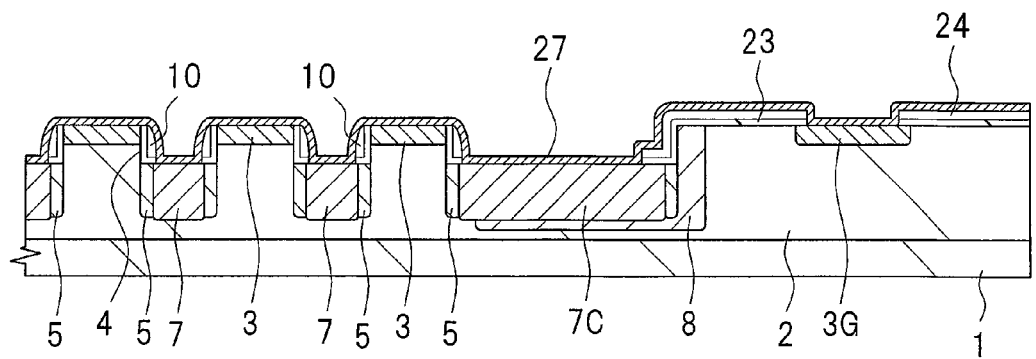
FIG. 7C is a sectional view of a principal part of the SiC substrate showing the manufacturing method of the vertical junction FET continued from FIG. 7B.

Next, after the photoresist film 26 is removed, as shown in FIG. 7C, a Ni film 27 is deposited on the main surface of the n⁺-type SiC substrate 1 by sputtering. Subsequently, the n⁺-type SiC substrate 1 is annealed, thereby causing each of the n⁺-type source layers 3 and the p-type gate layers 7 and 7C to react with the Ni film 27 (silicidation reaction).

Figure 8A:
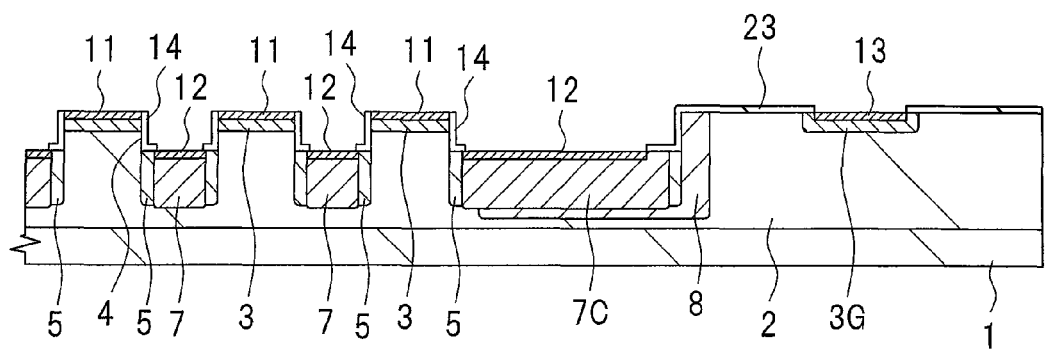
FIG. 8A is a sectional view of a principal part of the SiC substrate showing the manufacturing method of the vertical junction FET continued from FIG. 7C.

Next, the unreacted Ni film 27 and the barrier metal film 24 are removed. In this manner, as shown in FIG. 8A, the source contact layer 11 made of a Ni silicide film is formed on each surface of the n⁺-type source layer 3, and the gate contact layer 12 made of a Ni silicide film is formed on each surface of the p-type gate layers 7 and 7C. Also, a guard ring contact layer 13 made of a Ni silicide film is formed on the surface of the n⁺-type guard ring layer 3G.

The source contact layer 11 is a conducive layer for the ohmic connection between the n⁺-type source layer 3 and the source electrode 16 to be formed in a later process, and the gate contact layer 12 is a conductive layer for the ohmic connection between the p-type gate layers 7 and 7C and the gate electrode to be formed in a later process. Also, the guard ring contact layer 13 is a conductive layer for the ohmic connection between the n⁺-type guard ring layer 3G and the guard ring wiring 18 to be formed in a later process.

Also, by removing the barrier metal films 24 constituting parts of the sidewall spacers 10, the sidewall spacers 14 made of the silicon oxide film 23 are formed on the sidewalls of the shallow trenches 4 and 4C.

Figure 8B:
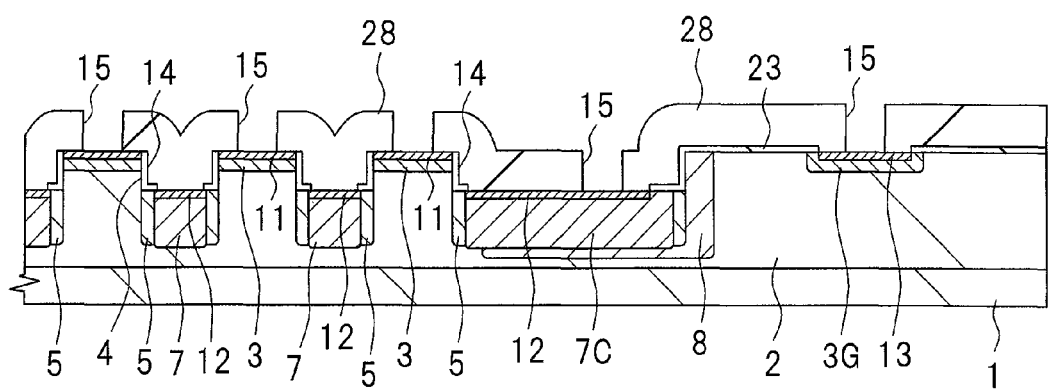
FIG. 8B is a sectional view of a principal part of the SiC substrate showing the manufacturing method of the vertical junction FET continued from FIG. 8A.

Next, as shown in FIG. 8B, after the interlayer insulating film 28 made of a silicon oxide film is deposited on the main surface of the n⁺-type SiC substrate 1 by using CVD, the interlayer insulating film 28 is patterned by dry etching with a photoresist film used as a mask, thereby forming a contact hole 15 on each of the n⁺-type source layers 3, the p-type gate layer 7C, and the n⁺-type guard ring layer 3G. Also, in a region not shown in the drawings, a contact hole is formed also in the silicon oxide film 28 on the p-type gate layer 7.

Figure 8C:
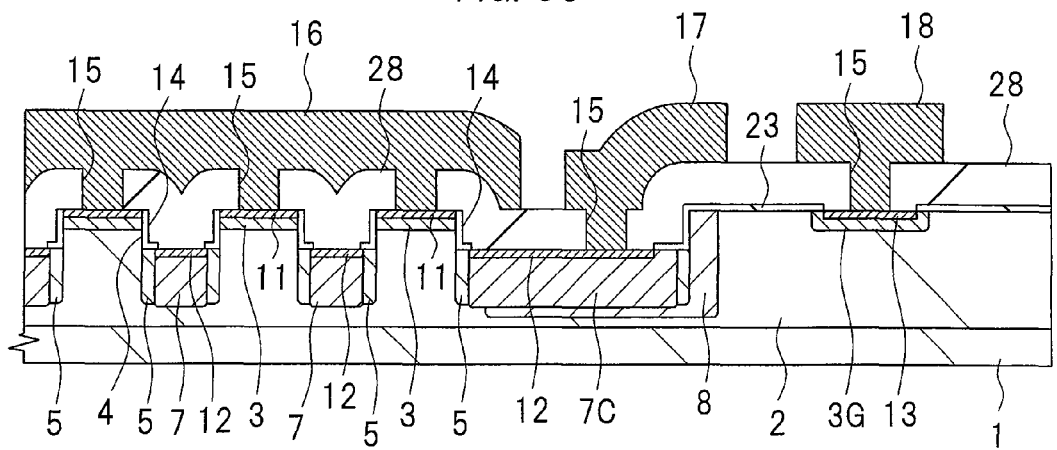
FIG. 8C is a sectional view of a principal part of the SiC substrate showing the manufacturing method of the vertical junction FET continued from FIG. 8B.

Next, as shown in FIG. 8C, after a metal film containing Al as a main component is deposited on the main surface of the n⁺-type SiC substrate 1 by sputtering, this metal film is patterned by dry etching with a photoresist film used as a mask. In this manner, the source electrode 16 electrically connected to the source contact layer 11 on the surface of the n⁺-type source layer 3, the gate electrode 17 electrically connected to the gate contact layer 12 of the p-type gate layer 7C, and the guard ring wiring 18 electrically connected to the guard ring contact layer 13 on the surface of the n⁺-type guard ring layer 3G are formed. In a region not shown in the drawings, the gate electrode 17 is electrically connected also to the gate contact layer 12 on the surface of the p-type gate layer 7.

Figure 9A:
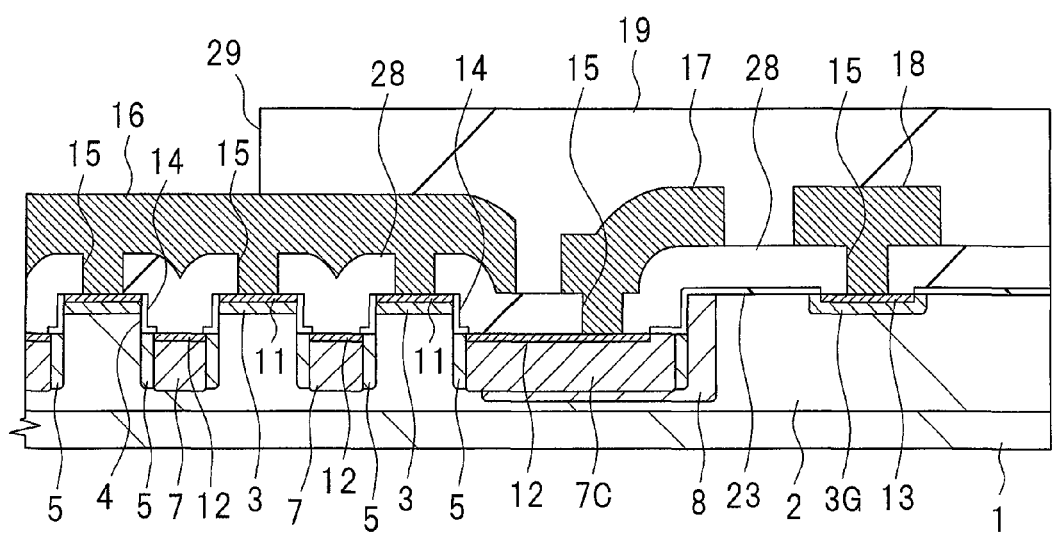
FIG. 9A is a sectional view of a principal part of the SiC substrate showing the manufacturing method of the vertical junction FET continued from FIG. 8C.

Next, as shown in FIG. 9A, after the surface protection film 19 made of a polyimide resin film is formed on the uppermost part of the main surface of the n⁺-type SiC substrate 1, the opening 29 is formed in the surface protection film 19 on the source electrode 16. The source electrode 16 exposed to the bottom of this opening 29 forms a source pad. Also, in a region not shown in the drawings, an opening is formed in the surface protection film 19 on the gate electrode 17, thereby forming a gate pad.

Figure 9B:
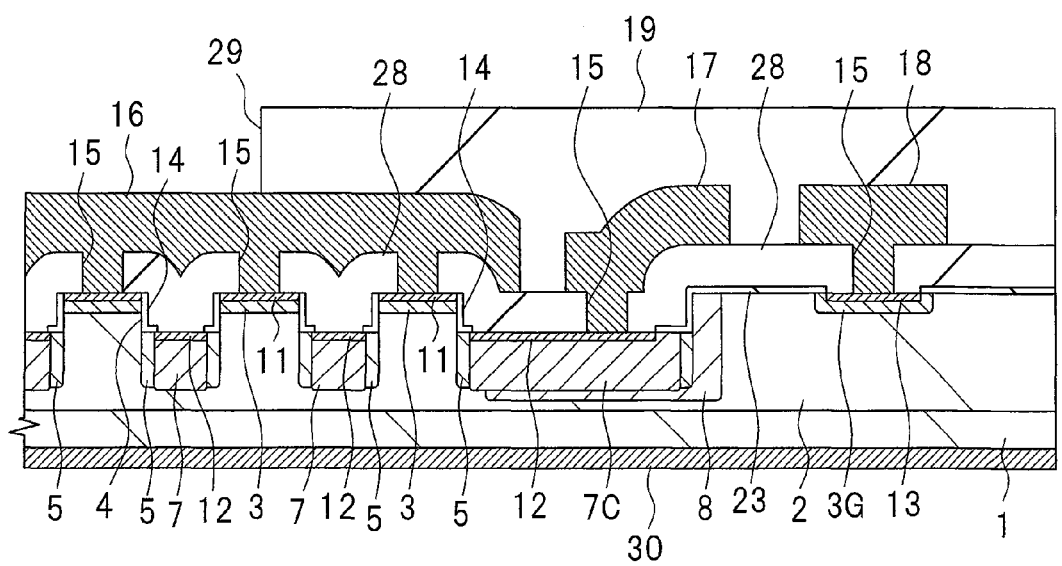
FIG. 9B is a sectional view of a principal part of the SiC substrate showing the manufacturing method of the vertical junction FET continued from FIG. 9A.

Next, as shown in FIG. 9B, the drain electrode 30 is formed on the entire back surface of the n⁺-type SiC substrate 1, thereby completing the vertical junction FET of the first embodiment shown in FIG. 1. The drain electrode 30 is made of a Ni silicide film and has a surface plated with Au (gold).

In the vertical junction FET of the first embodiment fabricated through the process described above, the following effects can be obtained.

Since the n-type counter dope layer 5 and the p-type gate layer 7 are formed in the n⁻-type drift layer 2 by using the vertical ion implantation method, the impurity concentration profile of the p-type gate layer 7 can be accurately controlled in comparison with a conventional manufacturing method of a trench-type junction FET, in which the sidewalls and bottom surface of a trench are doped with p-type impurities by using an oblique ion implantation method and a vertical ion implantation method in combination, thereby forming a p-type gate region.

Also, since it becomes unnecessary to consider diffusion variations of the impurities in a lateral direction caused due to the oblique ion implantation method, the dimensional accuracy of the width (G) of the p-type gate layer 7 can be improved. This means that a process margin for obtaining stable high yields can be easily ensured and a more severe on-resistance design can be made while ensuring a withstand voltage margin.

Furthermore, since the p-type gate layer 7 is formed in a self-alignment manner with respect to the sidewall spacers 6 formed on the sidewalls of the shallow trenches 4, the width (G) of the p-type gate layer 7 can be made narrower than the processing limit. Therefore, since a ratio of an area of the n⁺-type source layer 3 serving as a current path occupying the active region can be increased, the density of the current flowing between the source and the drain can be improved and the on-resistance of the whole chip can be reduced. In other words, the chip size can be reduced without reducing the current density.

In the structure in which the n⁺-type source layer 3 and the p-type gate layer 7 are in contact with each other, the occurrence of a leakage current at a junction part therebetween is a matter of concern (see Patent Document 2). However, since the n⁺-type source layer 3 and the p-type gate layer 7 are not in contact with each other, the leakage current can be suppressed.

Modification Example of First Embodiment

In the first embodiment, after the shallow trenches 4 are formed in the n⁻-type drift layer 2, impurities are ion-implanted to the n⁻-type drift layer 2 below the shallow trenches 4, thereby forming the n-type counter dope layers 5 and the p-type gate layer 7C. Alternatively, the n-type counter dope layers 5 and the p-type gate layer 7C can be formed while omitting the shallow trenches 4 by the following method.

Figure 10A:
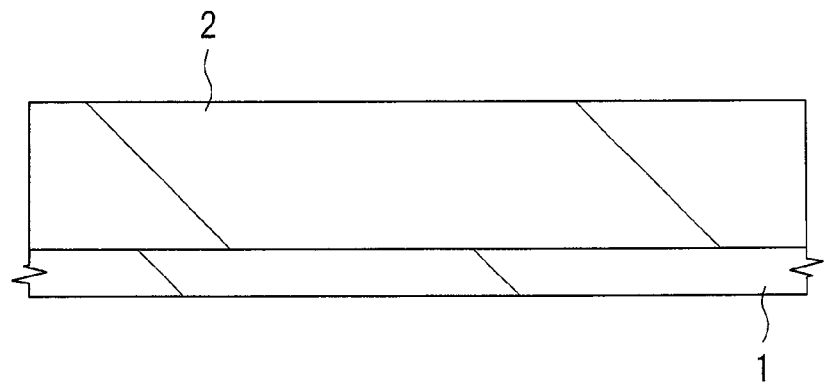
FIG. 10A is a sectional view of a principal part of a SiC substrate showing a manufacturing method of a vertical junction FET of a modification example of the first embodiment.
Figure 10B:
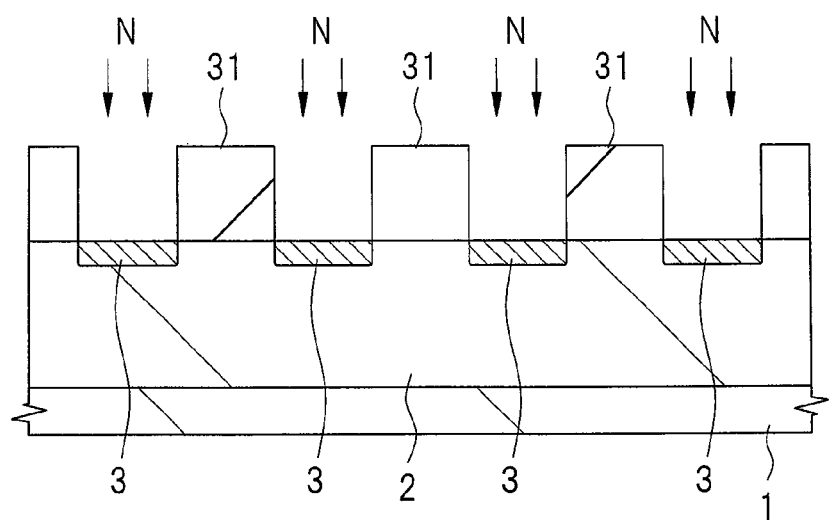
FIG. 10B is a sectional view of a principal part of the SiC substrate showing the manufacturing method of the vertical junction FET continued from FIG. 10A.

First, after the n⁻-type drift layer 2 is formed on the main surface of the n⁺-type SiC substrate 1 by a method similar to that of the first embodiment as shown in FIG. 10A, a silicon oxide film 31 is deposited on the main surface of the n⁺-type SiC substrate 1 by using CVD, and the silicon oxide film 31 is patterned by dry etching with a photoresist film used as a mask as shown in FIG. 10B. Subsequently, with this silicon oxide film 31 used as a mask, n-type impurities (nitrogen) are ion-implanted to the n⁻-type drift layer 2, thereby forming the n⁺-type source layers 3.

Figure 10C:
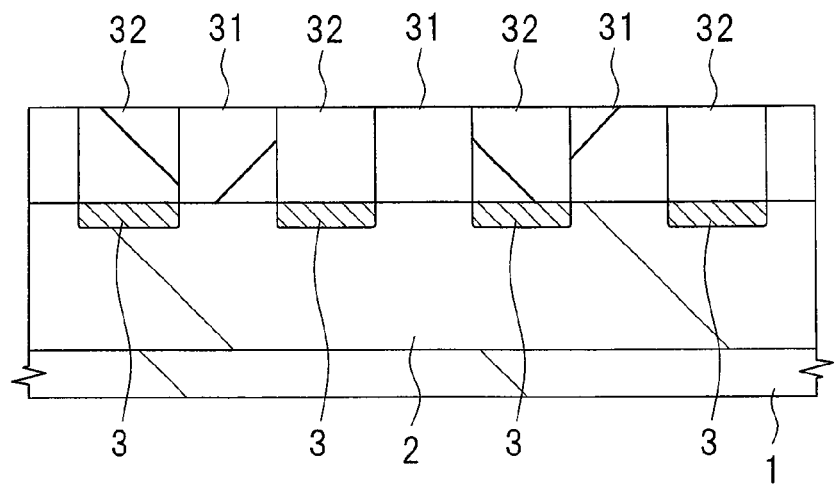
FIG. 10C is a sectional view of a principal part of the SiC substrate showing the manufacturing method of the vertical junction FET continued from FIG. 10B.

Next, as shown in FIG. 10C, after a silicon nitride film 32 is deposited on the main surface of the n⁺-type SiC substrate 1 by using CVD, the silicon nitride film 32 is polished by using chemical-mechanical polishing so as to recede until the surface of the silicon nitride film 32 is exposed.

Figure 11A:
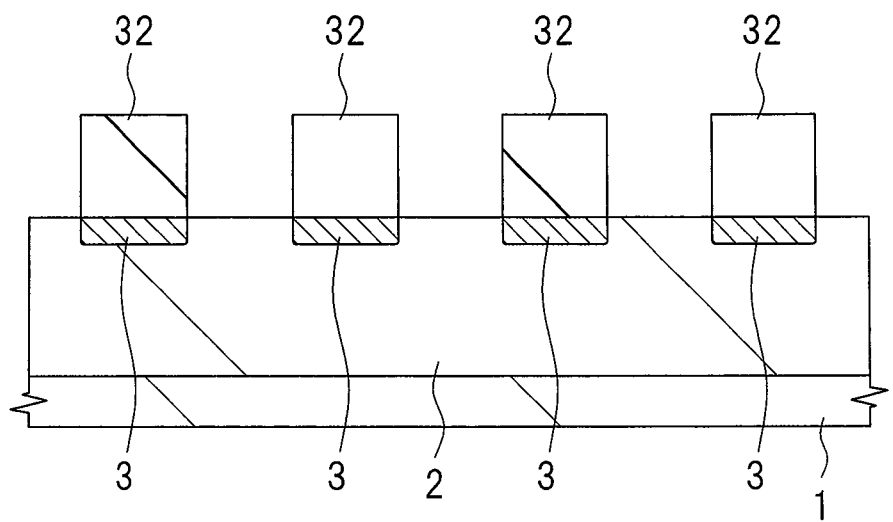
FIG. 11A is a sectional view of a principal part of the SiC substrate showing the manufacturing method of the vertical junction FET continued from FIG. 10C.

Next, as shown in FIG. 11A, the silicon oxide film 31 is selectively etched by using a difference in etching rate between the silicon oxide film 31 and the silicon nitride film 32, thereby leaving the silicon nitride film 32 on each of the n⁺-type source layers 3.

Figure 11B:
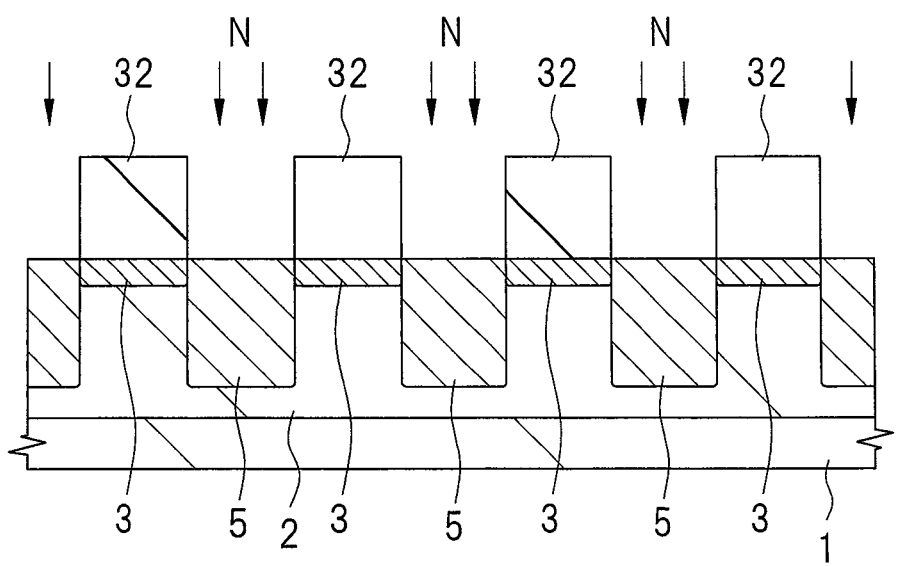
FIG. 11B is a sectional view of a principal part of the SiC substrate showing the manufacturing method of the vertical junction FET continued from FIG. 11A.

Next, as shown in FIG. 11B, n-type impurities (nitrogen) are ion-implanted to the n⁻-type drift layer 2 with the silicon nitride film 32 used as a mask, thereby forming the n-type counter dope layers 5. As with the first embodiment, the n-type counter dope layers 5 are formed by using a vertical ion implantation method performed by multi-step implantation of n-type impurities with varied acceleration voltages.

Figure 12A:
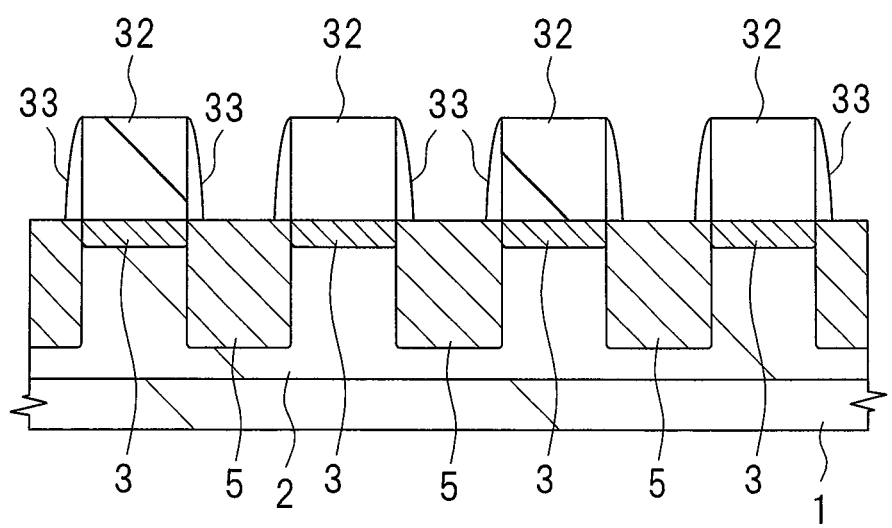
FIG. 12A is a sectional view of a principal part of the SiC substrate showing the manufacturing method of the vertical junction FET continued from FIG. 11B.

Next, as shown in FIG. 12A, after a silicon nitride film is deposited on the main surface of the n⁺-type SiC substrate 1 by using CVD, this silicon nitride film is subjected to anisotropic etching, thereby forming sidewall spacers 33 on sidewalls of the silicon nitride films 32.

Figure 12B:
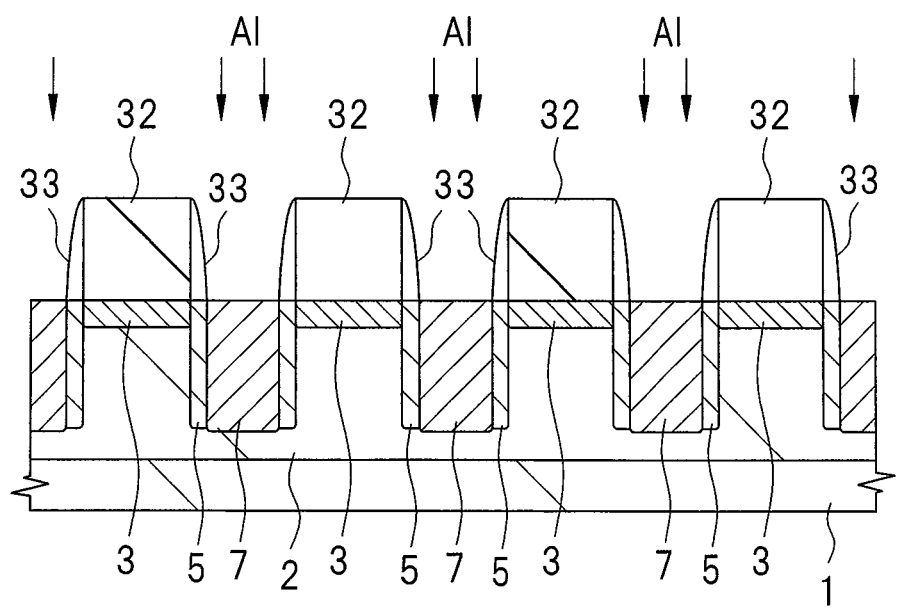
FIG. 12B is a sectional view of a principal part of the SiC substrate showing the manufacturing method of the vertical junction FET continued from FIG. 12A.

Next, as shown in FIG. 12B, with the silicon nitride films 32 and the sidewall spacers 33 used as masks, p-type impurities (aluminum or boron) are ion-implanted to the n⁻-type drift layer 2, thereby forming the p-type gate layers 7 in a self-alignment manner with respect to the sidewall spacers 33. The p-type gate layers 7 are formed by using a vertical ion implantation method performed by multi-step implantation of p-type impurities with varied acceleration voltages.

Figure 13:
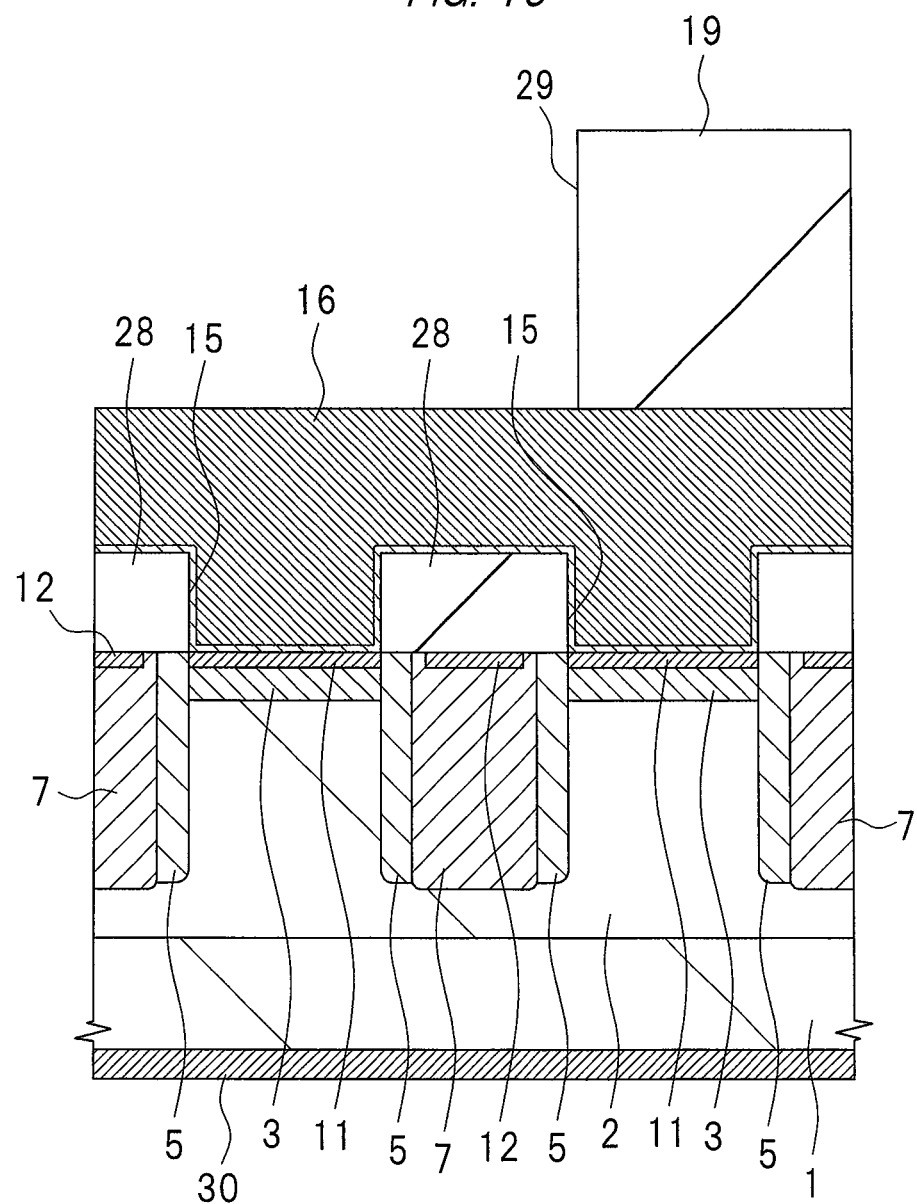
FIG. 13 is a sectional view of a part of an active region of the SiC substrate having the vertical junction FET of the modification example of the first embodiment formed thereon.

The processes thereafter are approximately similar to those of the first embodiment, and therefore are not described here. FIG. 13 is a sectional view of a part of an active region of the SiC substrate having the vertical junction FET of the modification example of the first embodiment formed thereon.

Also in this modification example, since the n-type counter dope layers 5 and the p-type gate layers 7 are formed by doping of impurities by using the vertical ion implantation method, the dimensional accuracy of the width (G) of the p-type gate layer 7 can be improved in comparison with the conventional manufacturing method of a trench-type junction FET.

Also, since the ratio of an area of the n⁺-type source layer 3 occupying the active region can be increased, the density of the current flowing between the source and the drain can be improved and the on-resistance of the whole chip can be decreased.

Furthermore, since the n⁺-type source layer 3 and the p-type gate layer 7 are not in contact with each other via the n-type counter dope layer 5, a leakage current can also be suppressed.

Second Embodiment

A manufacturing method of a vertical junction FET of a second embodiment is described with reference to the drawings in the order of the process.

Figure 14A:
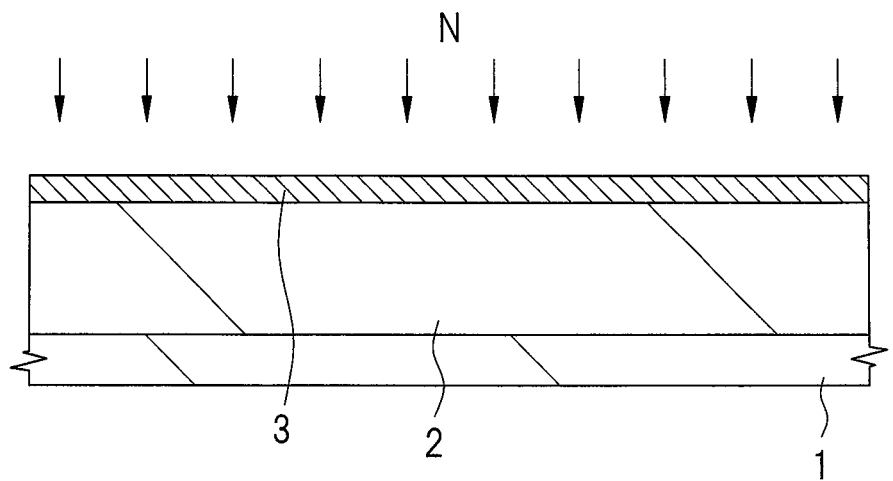
FIG. 14A is a sectional view of a principal part of a SiC substrate showing a manufacturing method of a vertical junction FET of a second embodiment.
Figure 14B:
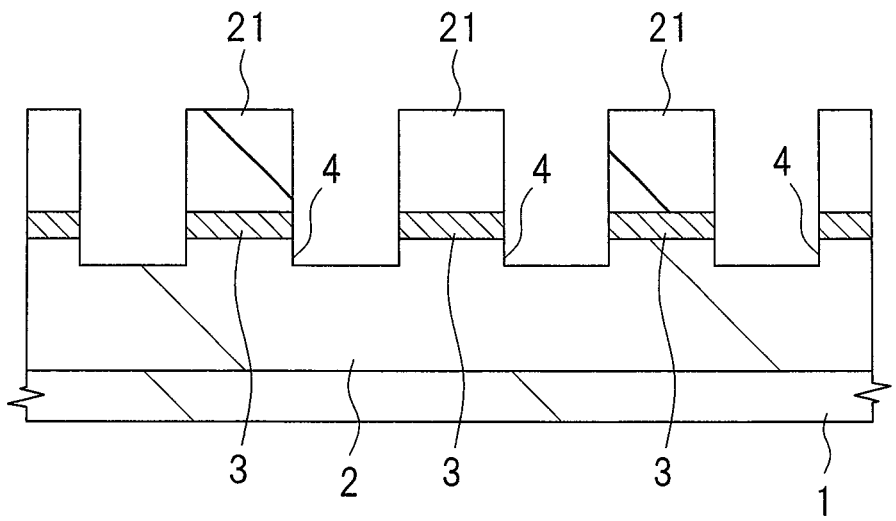
FIG. 14B is a sectional view of a principal part of the SiC substrate showing the manufacturing method of the vertical junction FET continued from FIG. 14A.

First, as shown in FIG. 14A, after the n⁻-type drift layer 2 is formed on the main surface of the n⁺-type SiC substrate 1, n-type impurities (nitrogen) are ion-implanted to the n⁻-type drift layer 2 of the active region, thereby forming the n⁺-type source layer 3. Subsequently, as shown in FIG. 14B, after the silicon oxide film 21 deposited on the main surface of the n⁺-type SiC substrate 1 is patterned, the n⁺-type source layer 3 and the n⁻-type drift layer 2 therebelow are subjected to dry etching with this silicon oxide film 21 used as a mask, thereby forming the plurality of shallow trenches 4. The processes so far are similar to those shown in FIG. 2A to FIG. 2C of the first embodiment.

Figure 15A:
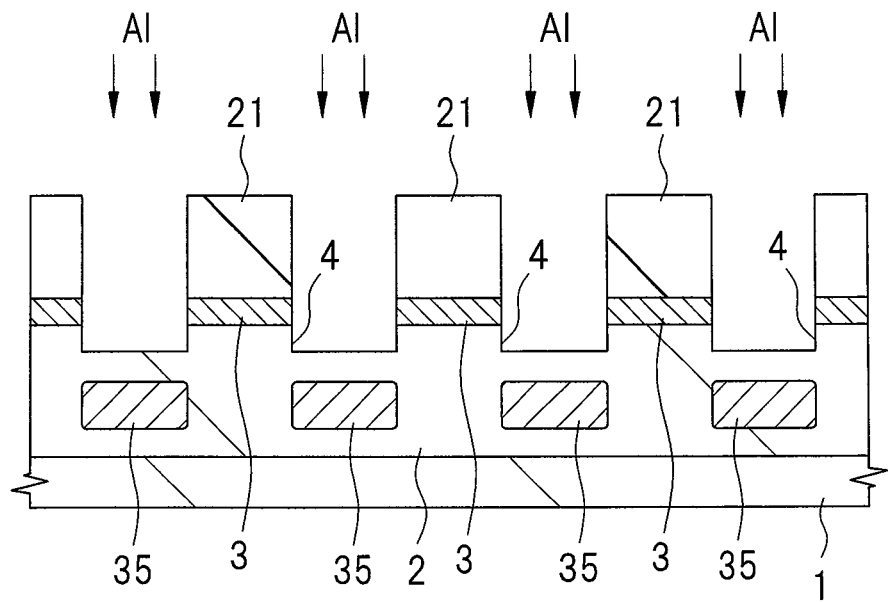
FIG. 15A is a sectional view of a principal part of the SiC substrate showing the manufacturing method of the vertical junction FET continued from FIG. 14B.

Next, as shown in FIG. 15A, with the silicon oxide film 21 used as a mask, p-type impurities (aluminum or boron) are ion-implanted to the n⁻-type drift layer 2 below the shallow trenches 4, thereby forming p-type gate layers (first gate layer) 35. At this time, as with the p-type gate layers 7 of the first embodiment, ion implantation of p-type impurities is performed by a vertical ion implantation method, but the ion implantation is performed with a high acceleration voltage of about 200 KeV to 600 KeV in this case, thereby forming the p-type gate layers 35 in a deep region of the n⁻-type drift layer 2.

Figure 15B:
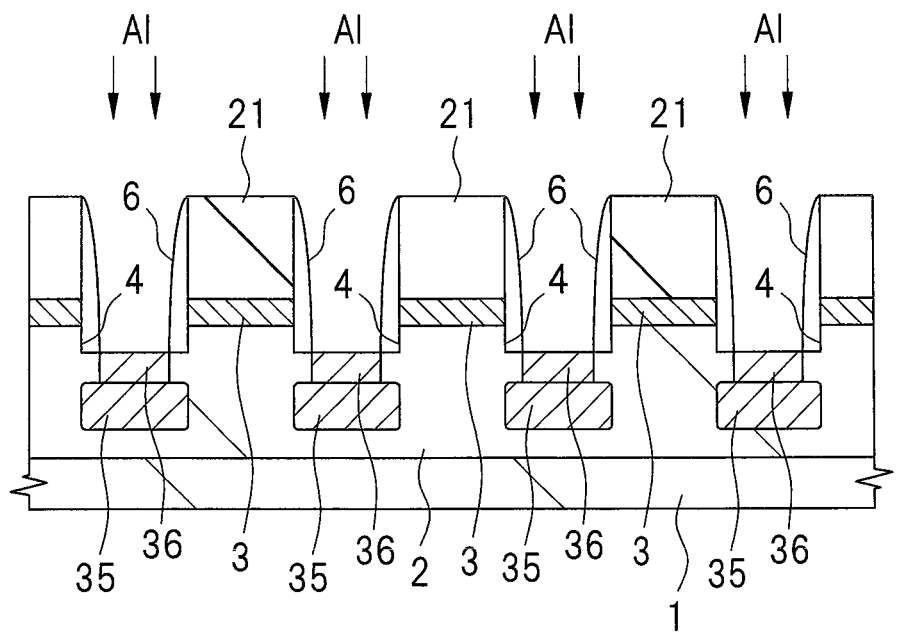
FIG. 15B is a sectional view of a principal part of the SiC substrate showing the manufacturing method of the vertical junction FET continued from FIG. 15A.

Next, as shown in FIG. 15B, the sidewall spacers 6 made of a silicon oxide film are formed on the sidewalls of the silicon oxide film 21 and the shallow trenches 4 by a method similar to that of the first embodiment. Then, with the silicon oxide film 21 and the sidewall spacers 6 used as masks, p-type impurities (aluminum or boron) are ion-implanted to the n⁻-type drift layer 2 below the shallow trenches 4, thereby forming p-type gate layers 36 (second gate layer). At this time, as with the p-type gate layers 7 of the first embodiment, ion implantation of p-type impurities is performed by a vertical ion implantation method, but the ion implantation is performed with a low acceleration voltage lower than 200 KeV in this case, thereby forming the p-type gate layers 36 in a shallow region of the n⁻-type drift layer 2, that is, on the p-type gate layers 35. Also, the impurity concentration of the p-type gate layer 36 is approximately the same as the impurity concentration of the p-type gate layer 35.

In this manner, the p-type gate layer has a retrograde structure composed of the p-type gate layer 35 formed in the deep region of the n⁻-type drift layer 2 and having a wide width and the p-type gate layer 36 formed in the shallow region of the n⁻-type drift layer 2 and having a narrow width.

Figure 16:
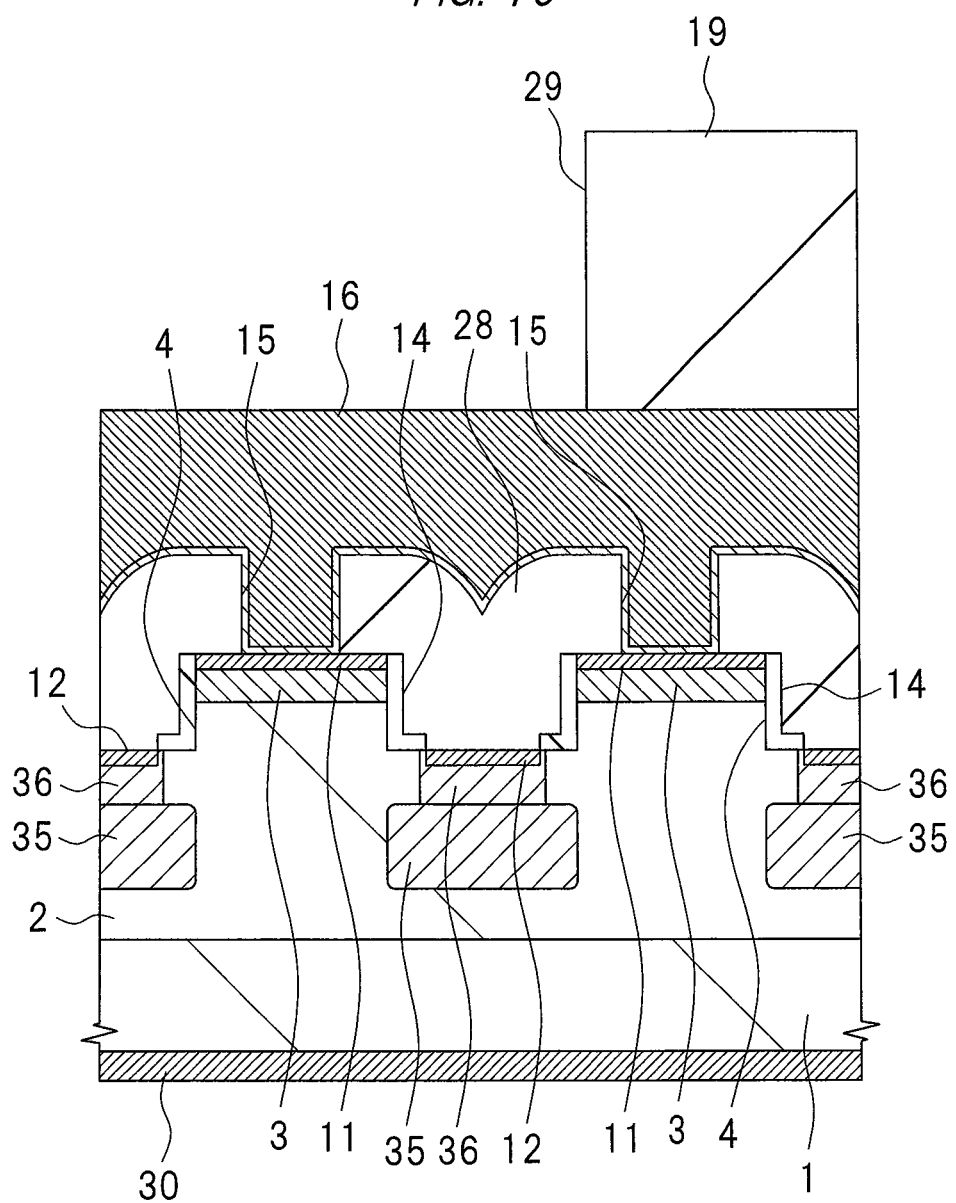
FIG. 16 is a sectional view of a part of an active region of the SiC substrate having the vertical junction FET of the second embodiment formed thereon.

The processes thereafter are approximately similar to those of the first embodiment, and therefore are not described here. FIG. 16 is a sectional view of a part of an active region of the SiC substrate having the vertical junction FET of the second embodiment formed thereon.

According to the second embodiment, since the p-type gate layers 35 and 36 are formed by doping of impurities by using the vertical ion implantation method, the dimensional accuracy of the widths of the p-type gate layers 35 and 36 can be improved.

Also, since the p-type gate layer has the retrograde structure as described above, the performance of the vertical junction FET can be enhanced.

Furthermore, since the $n^+$-type source layer 3 and the p-type gate layers 35 and 36 are not in contact with each other, a leakage current can be suppressed.

Third Embodiment

Figure 17:
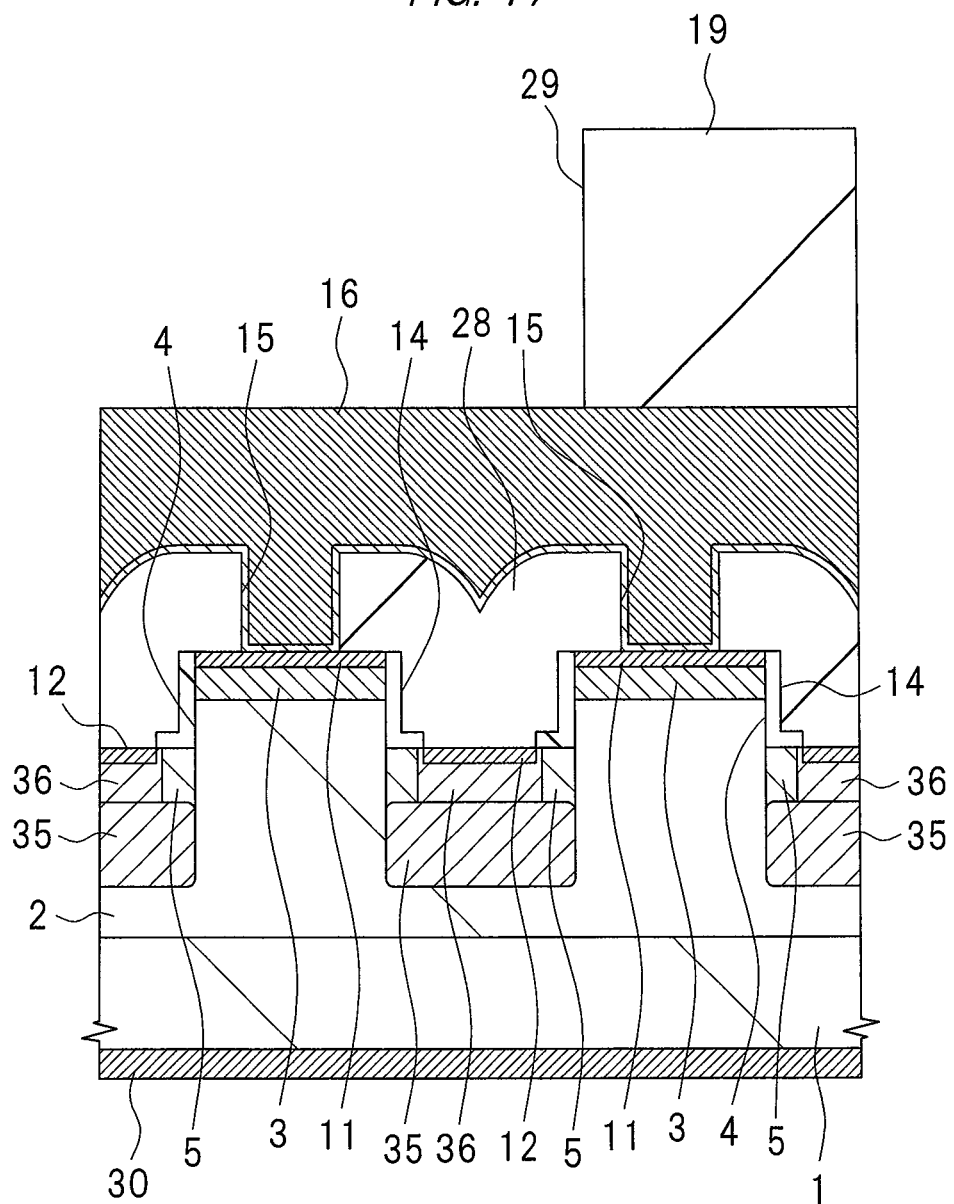
FIG. 17 is a sectional view of a part of an active region of a SiC substrate having a vertical junction FET of a third embodiment formed thereon.

A vertical junction FET of a third embodiment is obtained by combining the vertical junction FET of the first embodiment and the vertical junction FET of the second embodiment together. More specifically, as shown in FIG. 17, in the vertical junction FET of the third embodiment, the p-type gate layer having the retrograde structure as that of the second embodiment is adopted in the vertical junction FET of the first embodiment.

A manufacturing method of the vertical junction FET of the third embodiment is described with reference to the drawings in the order of the process.

Figure 18A:
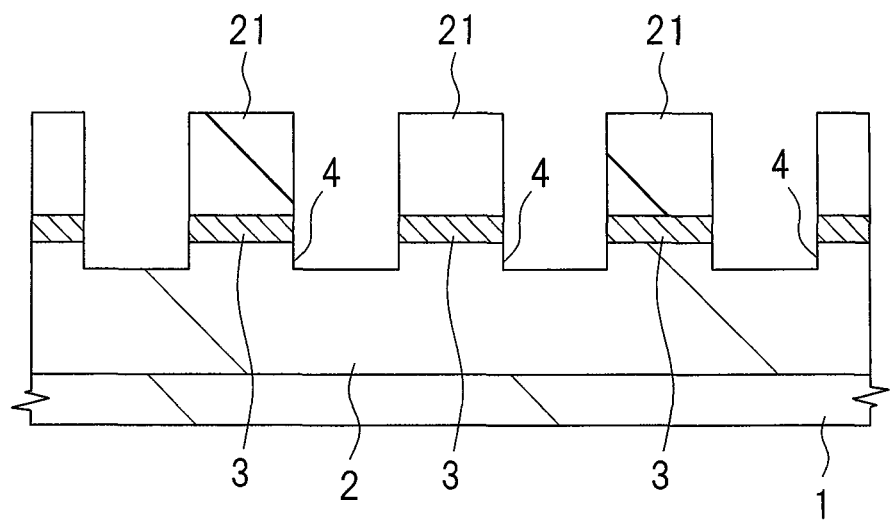
FIG. 18A is a sectional view of a principal part of the SiC substrate showing a manufacturing method of the vertical junction FET of the third embodiment.

First, as shown in FIG. 18A, the $n^-$-type drift layer 2 is formed on the main surface of the $n^+$-type SiC substrate 1. Subsequently, the $n^+$-type source layer 3 is formed on the $n^-$-type drift layer 2, and then the plurality of shallow trenches 4 are formed in the $n^-$-type drift layer 2 by dry etching with the silicon oxide film 21 used as a mask.

Figure 18B:
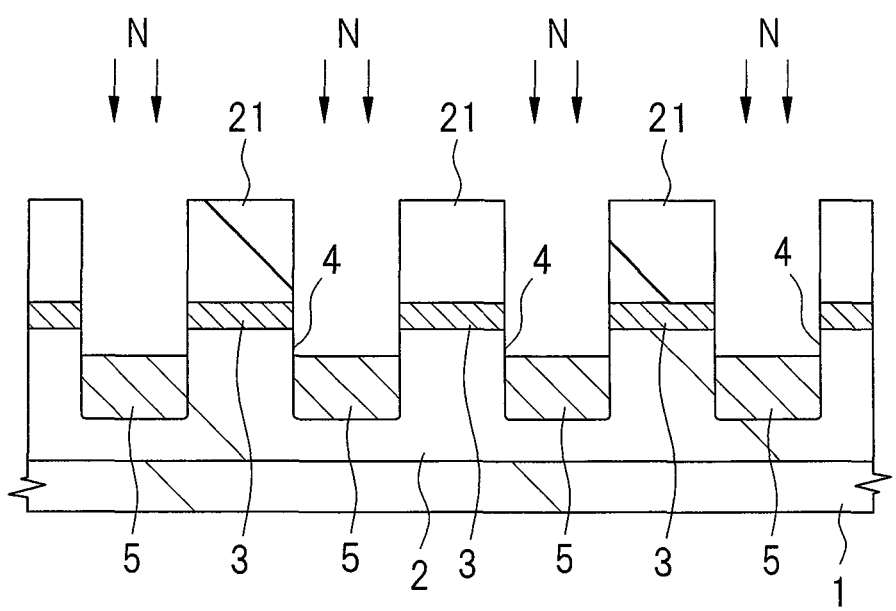
FIG. 18B is a sectional view of a principal part of the SiC substrate showing the manufacturing method of the vertical junction FET continued from FIG. 18A.

Next, as shown in FIG. 18B, with the silicon oxide film 21 used as a mask, n-type impurities (nitrogen) are ion-implanted to the $n^-$-type drift layer 2 below the shallow trenches 4, thereby forming the n-type counter dope layers 5. The processes so far are the same as those shown in FIG. 2A to FIG. 4A of the first embodiment.

Figure 19A:
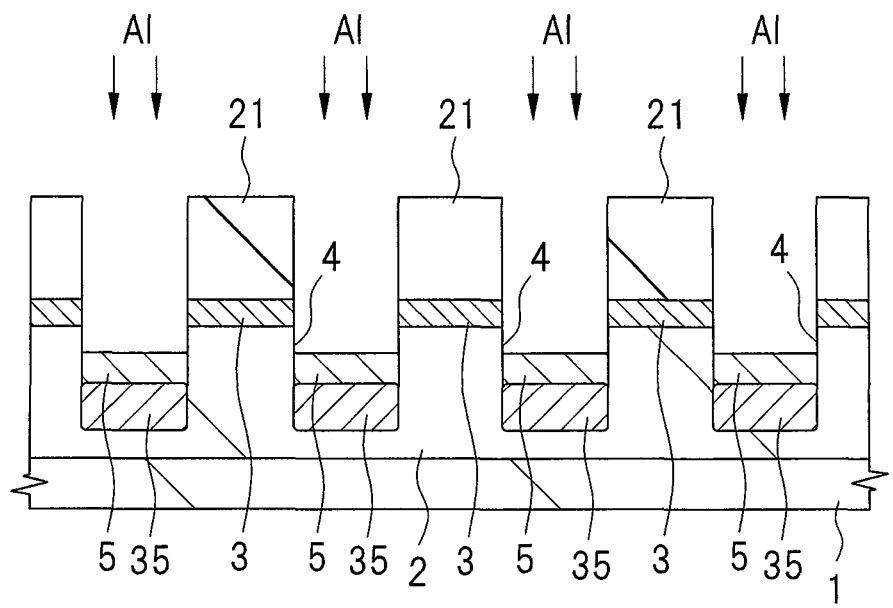
FIG. 19A is a sectional view of a principal part of the SiC substrate showing the manufacturing method of the vertical junction FET continued from FIG. 18B.

Next, as shown in FIG. 19A, with the silicon oxide film 21 used as a mask, p-type impurities (aluminum) are ion-implanted to the $n^-$-type drift layer 2 below the shallow trenches 4, thereby forming the p-type gate layers 35. This ion implantation of the p-type impurities is performed by a vertical ion implantation method, and as with the second embodiment, the ion implantation is performed with a high acceleration voltage of about 200 KeV to 600 KeV, thereby forming the p-type gate layers 35 in a deep region of the $n^-$-type drift layer 2.

Figure 19B:
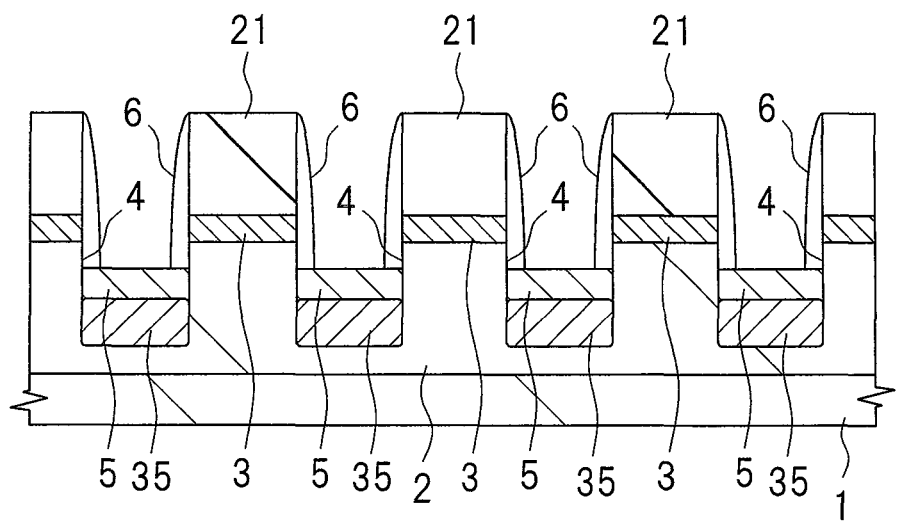
FIG. 19B is a sectional view of a principal part of the SiC substrate showing the manufacturing method of the vertical junction FET continued from FIG. 19A.
Figure 20:
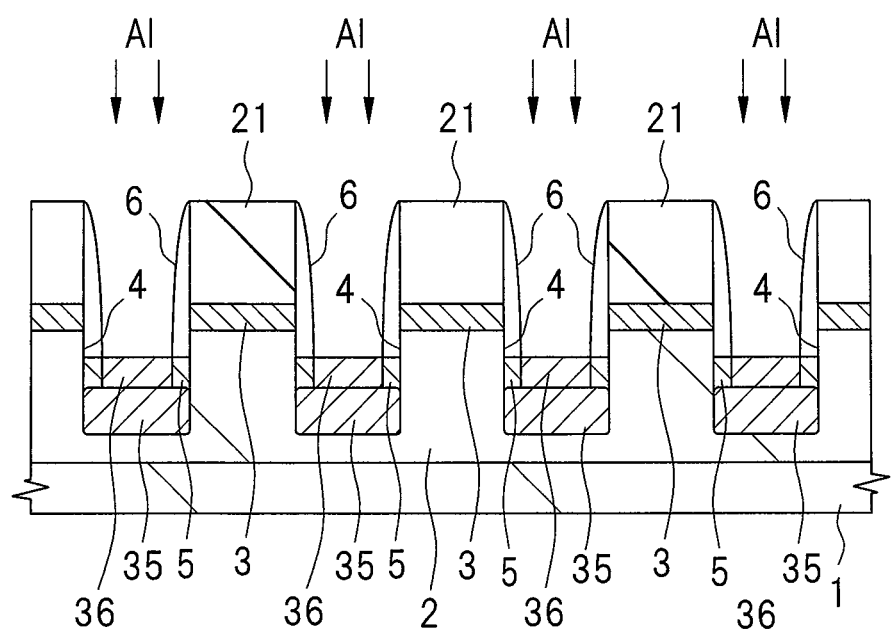
FIG. 20 is a sectional view of a principal part of the SiC substrate showing the manufacturing method of the vertical junction FET continued from FIG. 19B.

Next, as shown in FIG. 19B, the sidewall spacers 6 made of a silicon oxide film are formed on the sidewalls of the silicon oxide film 21 and the shallow trenches 4 by a method similar to that of the first embodiment. Then, as shown in FIG. 20, with the silicon oxide film 21 and the sidewall spacers 6 used as masks, p-type impurities (aluminum) are ion-implanted to the $n^-$-type drift layer 2 below the shallow trenches 4, thereby forming the p-type gate layers 35. This ion implantation of the p-type impurities is performed by a vertical ion implantation method, and as with the second embodiment, the ion implantation is performed with a low acceleration voltage lower than 200 KeV, thereby forming the p-type gate layers 36 in a shallow region of the $n^-$-type drift layer 2.

In this manner, the p-type gate layer has a retrograde structure composed of the p-type gate layer 35 formed in the deep region of the $n^-$-type drift layer 2 and having a wide width and the p-type gate layer 36 formed in the shallow region of the $n^-$-type drift layer 2 and having a narrow width. Also, the n-type counter dope layer 5 is disposed so as to be adjacent to the p-type gate layer 36 formed in the shallow region.

According to the third embodiment, the effects of the first embodiment and the effects of the second embodiment described above can be obtained.

In the foregoing, the invention made by the inventors of the present invention has been concretely described based on the embodiments. However, it is needless to say that the present invention is not limited to the foregoing embodiments and various modifications and alterations can be made within the scope of the present invention.

Figure 21:
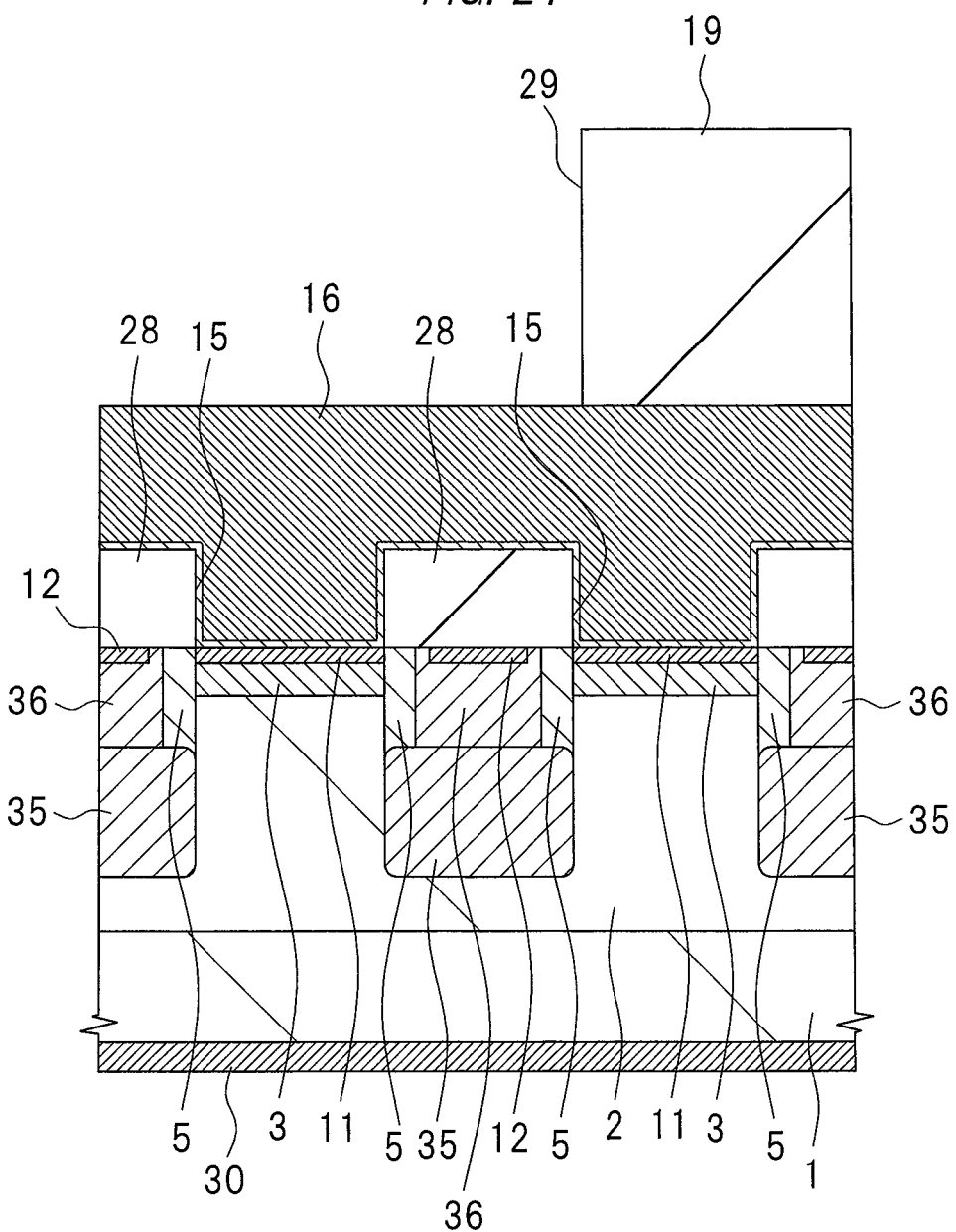
FIG. 21 is a sectional view of a part of an active region of a SiC substrate having a vertical junction FET of another embodiment formed thereon.

For example, although the vertical junction FET of the first embodiment and the vertical junction FET of the second embodiment are combined together in the third embodiment, it is also possible to combine the vertical junction FET of the modification example of the first embodiment and the vertical junction FET of the second embodiment together as shown in FIG. 21.

In addition, some of contents described in the embodiments are described below.

(1) A manufacturing method of a semiconductor device having a junction field effect transistor formed on a main surface of a semiconductor substrate of a first conductivity type includes:

(a) a step of forming a drift layer of the first conductivity type on the semiconductor substrate of the first conductivity type;

(b) a step of forming a plurality of source layers of the first conductivity type disposed at predetermined intervals on a surface of the drift layer by doping the drift layer with first impurities with a first insulating film formed on the drift layer used as a mask;

(c) after the step (b), a step of removing the first insulating film and forming a second insulating film on each of the plurality of source layers;

(d) a step of forming a counter dope layer of the first conductivity type in the drift layer by doping the drift layer with second impurities by a vertical ion implantation method with the second insulating film used as a mask;

(e) after the step (d), a step of forming sidewall spacers made of a third insulating film on sidewalls of the second insulating film; and (f) a step of forming a gate layer of a second conductivity type in the drift layer by doping the drift layer with third impurities by the vertical ion implantation method with the second insulating film and the sidewall spacers used as masks.

(2) In the manufacturing method of a semiconductor device described in (1), the counter dope layer has an impurity concentration lower than an impurity concentration of the source layer.

(3) In the manufacturing method of a semiconductor device described in (1), the counter dope layer is formed so as to be in contact with a side surface of the gate layer.

(4) In the manufacturing method of a semiconductor device described in (1), the semiconductor substrate is made of silicon carbide, the first and second impurities are nitrogen, and the third impurities are aluminum or boron.

What is claimed is:

1. A manufacturing method of a semiconductor device having a junction field effect transistor formed on a main surface of a semiconductor substrate of a first conductivity type, comprising:

(a) a step of forming a drift layer of the first conductivity type on the semiconductor substrate;

(b) a step of forming a source layer of the first conductivity type on a surface of the drift layer by doping the drift layer with first impurities;

(c) after the step (b), a step of forming a plurality of trenches disposed at predetermined intervals in the surface of the drift layer by etching the surface of the drift layer with a first insulating film formed on the drift layer used as a mask;

(d) after the step (c), a step of forming a counter dope layer of the first conductivity type in the drift layer below each of the plurality of trenches by doping the drift layer below each of the plurality of trenches with second impurities by using a vertical ion implantation method;

(e) after the step (d), a step of forming a sidewall spacer made of a second insulating film on each sidewall of the first insulating film and the trenches; and (f) after the step (e), a step of forming a gate layer of a second conductivity type in the drift layer below each of the plurality of trenches by doping the drift layer below each of the plurality of trenches with third impurities by using the vertical ion implantation method.

2. The manufacturing method of a semiconductor device according to claim 1,
   wherein the trenches are formed so as to each have a bottom surface positioned lower than the source layer.

3. The manufacturing method of a semiconductor device according to claim 1,
   wherein the counter dope layer has an impurity concentration lower than an impurity concentration of the source layer.

4. The manufacturing method of a semiconductor device according to claim 1,
   wherein the counter dope layer is formed so as to be in contact with a side surface of the gate layer.

5. The manufacturing method of a semiconductor device according to claim 1,
   wherein the semiconductor substrate is made of silicon carbide, the first and second impurities are nitrogen, and the third impurities are aluminum or boron.

\* \* \* \* \*